(12) United States Patent
Zhao et al.

(10) Patent No.: US 11,925,076 B2
(45) Date of Patent: Mar. 5, 2024

(54) DISPLAY PANEL AND DISPLAY DEVICE

(71) Applicants: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

(72) Inventors: Zhe Zhao, Shanghai (CN); Shuai Yang, Shanghai (CN); Yue Li, Shanghai (CN); Xingyao Zhou, Shanghai (CN); Mengmeng Zhang, Shanghai (CN)

(73) Assignees: WUHAN TIANMA MICRO-ELECTRONICS CO., LTD., Wuhan (CN); WUHAN TIANMA MICROELECTRONICS CO., LTD. SHANGHAI BRANCH, Shanghai (CN)

(*) Notice: Subject to any disclaimer, the term of this patent is extended or adjusted under 35 U.S.C. 154(b) by 206 days.

(21) Appl. No.: 17/138,643

(22) Filed: Dec. 30, 2020

(65) Prior Publication Data
US 2021/0118976 A1  Apr. 22, 2021

(30) Foreign Application Priority Data
Sep. 30, 2020 (CN) .......................... 202011065986.2

(51) Int. Cl.
*H10K 59/131* (2023.01)
*H10K 77/10* (2023.01)

(52) U.S. Cl.
CPC .......... *H10K 59/131* (2023.02); *H10K 77/10* (2023.02)

(58) Field of Classification Search
CPC ............................. H10K 77/10; H10K 59/131
See application file for complete search history.

(56) References Cited

U.S. PATENT DOCUMENTS

| 2019/0066561 | A1* | 2/2019 | Yuan | G09G 3/20 |
| 2019/0236997 | A1* | 8/2019 | Han | G09G 3/3208 |
| 2020/0357875 | A1* | 11/2020 | Wang | H10K 59/131 |
| 2021/0158750 | A1* | 5/2021 | Xiang | G09G 3/3225 |
| 2021/0225996 | A1* | 7/2021 | Yu | H10K 71/00 |
| 2021/0367025 | A1* | 11/2021 | Huang | H10K 59/1213 |
| 2022/0005913 | A1* | 1/2022 | Xiao | H10K 59/1216 |

FOREIGN PATENT DOCUMENTS

| CN | 107331338 A | 11/2017 |
| CN | 107871765 A | 4/2018 |
| CN | 111613656 A | 9/2020 |

* cited by examiner

*Primary Examiner* — Vongsavanh Sengdara
(74) *Attorney, Agent, or Firm* — Alston & Bird LLP

(57) ABSTRACT

Provided are a display panel and a display device. The display panel includes a base substrate as well as, at a side of the base substrate, a plurality of sub-pixels arranged in an array, a power bus, a plurality of first power lines extending along a column direction and a plurality of second power lines extending along a row direction, where each of the plurality of first power lines is electrically connected to the plurality of the sub-pixels arranged along the column direction, and the plurality of first power lines and the plurality of second power lines are electrically connected in overlapping regions of vertical projection on the base substrate. The display panel further includes a plurality of connection units.

18 Claims, 19 Drawing Sheets

DISPLAY PANEL AND DISPLAY DEVICE

CROSS-REFERENCE TO RELATED APPLICATION

This application claims priority to Chinese Patent Application No. 202011065986.2 filed Sep. 30, 2020, the disclosure of which is incorporated herein by reference in its entirety.

TECHNICAL FIELD

The present disclosure relates to a display technology field and in particular, to a display panel and a display device.

BACKGROUND

An organic light-emitting diode (OLED) display panel is a display panel manufactured by using organic electroluminescent diodes. OLEDs had a wide range of applications in display screens from the advantages of no backlight, high contrast, small thickness, wide viewing angle, fast reaction speed, foldability and the like.

In the related OLED display panel, the function of a power line is to provide a voltage signal so that the pixel driving circuit generates a current for driving the light-emitting elements to emit light. However, due to the ohmic voltage drop on the power line, there is a difference between a power voltage signal closer to a driving chip and a power voltage signal farther from the driving chip in the OLED display panel, resulting in inconsistent brightness. Especially for a large-size display panel, a brightness difference between a position closer to the driving chip and a position farther from the driving chip is more obvious, thus leading to display non-uniformity of the display panel.

SUMMARY

The present disclosure provides a display panel and a display device to achieve the effect of improving the display uniformity of the display panel.

In a first aspect, a display panel is provided in an embodiment of the present disclosure and includes a base substrate; a plurality of sub-pixels arranged in an array, a power bus, a plurality of first power lines and a plurality of second power lines which are located at a side of the base substrate; and a plurality of connection units. The plurality of second power lines extend along a column direction and the plurality of second power lines extend along a row direction. Each of the plurality of first power lines is electrically connected to the plurality of sub-pixels arranged along the column direction, the plurality of first power lines and the plurality of second power lines have perpendicular projections respectively on a top surface of the base substrate, the perpendicular projections form overlapping regions, and the plurality of first power lines and the plurality of second power lines are electrically connected in the overlapping regions. A first end of each of the plurality of connection units is electrically connected to the power bus, a second end of each of the plurality of connection units is electrically connected to either one of the plurality of first power lines or one of the plurality of second power lines, and vertical projections of the second ends of the plurality of connection units on the top surface of the base substrate do not overlap one another. A difference of an electrical resistance between any two of the plurality of connection units is within a preset range.

In a second aspect, the present disclosure further provides a display device including the display panel described in the first aspect.

BRIEF DESCRIPTION OF DRAWINGS

Other features, objects and advantages of the present disclosure will become more apparent from a detailed description of non-restrictive embodiments with reference to the drawings.

DETAILED DESCRIPTION

The present disclosure will be described below in conjunction with the specific embodiments and the drawings in the embodiments. Apparently, the embodiments described herein are part, not all, of the embodiments of the present disclosure, and based on the embodiments of the present disclosure, all other embodiments obtained by those skilled in the art on the premise that no creative work is done are within the scope of the present disclosure.

Figure 1:
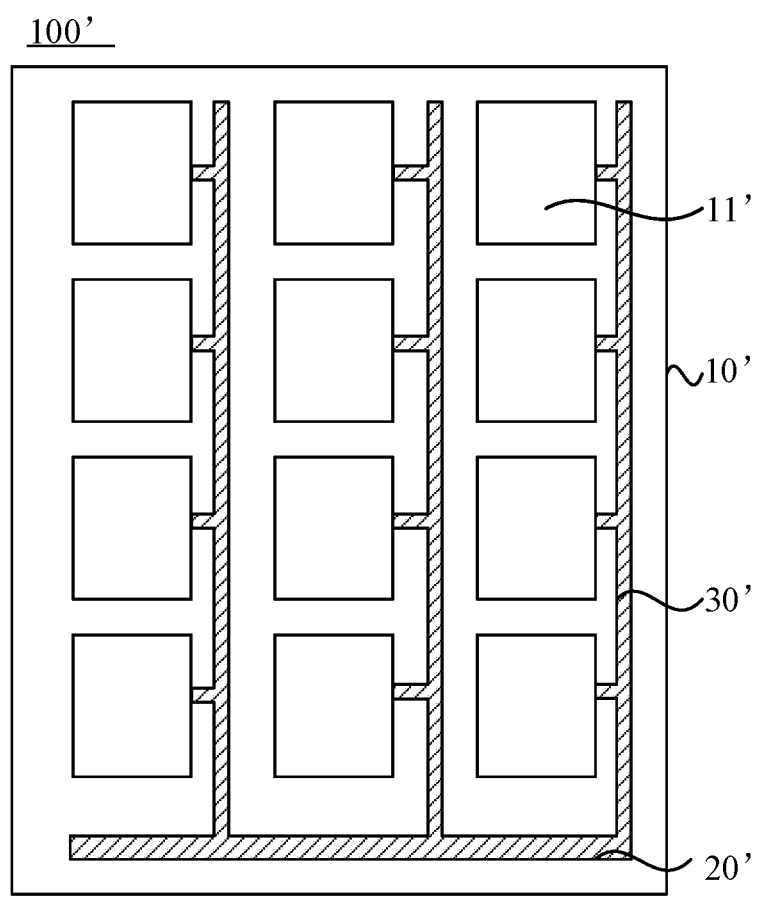
FIG. 1 is a structural diagram of a display panel in the related art.

FIG. 1 is a structural diagram of a display panel in the related art. As shown in FIG. 1, the display panel 100' in the related art includes a base substrate 10', and a plurality of sub-pixels 11' arranged in an array, a plurality of first power lines 30' and a power bus 20' which are located at a side of the base substrate 10', where each of the plurality of first power lines 30' is electrically connected to a plurality of sub-pixels 11' arranged along a column direction, and the power bus 20' is electrically connected to each of the first power lines 30'. The power bus 20' acquires a voltage signal from a driving chip and supplies a power voltage to a respective sub-pixel 11' through a corresponding first power line 30', so that a driving circuit generates a driving current to drive a light-emitting element to emit light. As can be seen from FIG. 1, in a case wherein a case where the power bus 20' supplies the power voltage to the respective sub-pixel 11' through the corresponding first power line 30', due to a voltage drop of the first power line 30', there is a difference between a power voltage acquired by a sub-pixel 11' closer to the power bus 20' and a sub-pixel 11' farther from the power bus 20', thus leading to the luminance inconsistency of the sub-pixel 11' closer to the power bus 20' and the sub-pixel 11' farther from the power bus 20'. Especially for a large-size display panel, the length of the first power line 30' is longer so that the difference between the power voltage acquired by the sub-pixel 11' closer to the power bus 20' and the power voltage acquired by the sub-pixel 11' farther from the power bus 20' is greater due to the voltage drop of the first power line 30' along the column, and thus the luminance difference between the sub-pixel 11' closer to the power bus 20' and the sub-pixel 11' farther from the power bus 20' is more apparent, thereby leading to the display non-uniformity of the display panel 100'.

A display panel is provided in an embodiment of the present disclosure and includes a base substrate, and a plurality of sub-pixels arranged in an array, a power bus, a plurality of first power lines and a plurality of second power lines which are located at a side of the base substrate, where the plurality of first power lines extend along a column direction and the plurality of second power lines extend along a row direction, where each of the plurality of first power lines is electrically connected to a plurality of the sub-pixels arranged along the column direction, and where the plurality of first power lines and the plurality of second power lines have perpendicular projections respectively on a top surface of the base substrate, where the perpendicular projections form overlapping regions, and the plurality of first power lines and the plurality of second power lines are electrically connected in the overlapping regions. The display panel further includes a plurality of connection units, where a first end of each of the plurality of connection units is electrically connected to the power bus, a second end of the each of the plurality of connection units is electrically connected to one of the plurality of first power lines or one of the plurality of second power lines, and vertical projections of the second ends of the plurality of connection units on a top surface of the base substrate is located do not overlap one another. A difference of an electrical resistance between any two of the plurality of connection units is within a preset range.

In the above solution, the power voltages acquired from the power bus are transmitted to the first power lines or the second power lines through the plurality of connection units so that since the difference of the electrical resistance between any two of the plurality of connection units is relative small, power voltages transmitted by the plurality of connection units to the first power lines or the second power lines are basically the same, that is, each connection unit only needs to provide a power voltage to sub-pixels in a region adjacent to each connection unit through the first power lines or the second power lines, thus reducing the drop amplitude of the power voltage in the small region and improving the uniformity of the display panel as a whole.

The above is the core concept of the present disclosure, and solutions in the embodiments of the present disclosure will be described clearly and completely in conjunction with the drawings in the embodiments of the present disclosure. Based on the embodiments of the present disclosure, all other embodiments obtained by those of ordinary skill in the art on the premise that no creative work is done are within the scope of the present disclosure.

Figure 2:
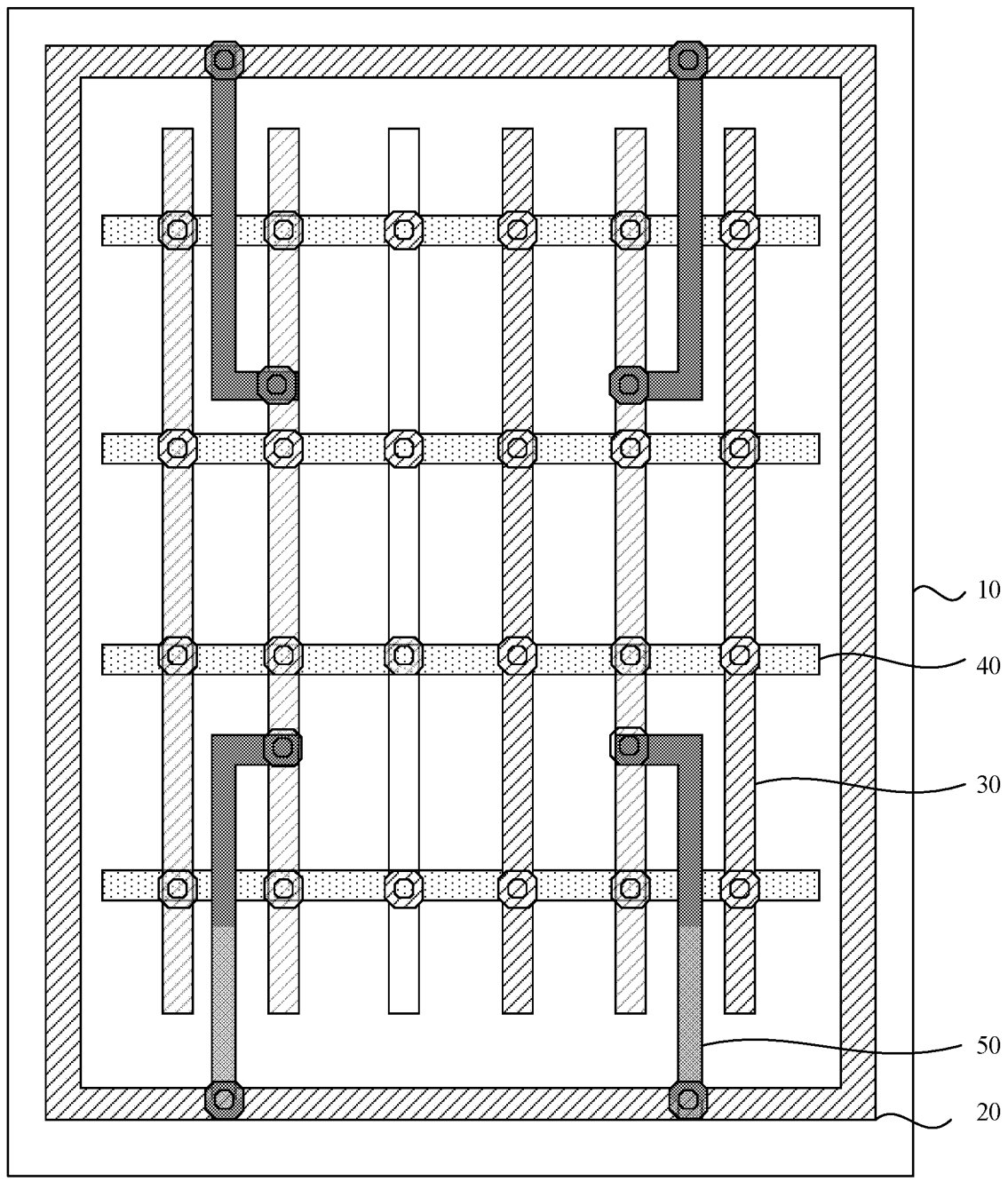
FIG. 2 is a structural diagram of a display panel according to an embodiment of the present disclosure.

FIG. 2 is a structural diagram of a display panel according to an embodiment of the present disclosure. As shown in FIG. 2, A display panel 100 is provided in the embodiment of the present disclosure and includes a base substrate 10 as well as, at a side of the base substrate 10, a plurality of sub-pixels (not shown in figure) arranged in an array, a power bus 20, a plurality of first power lines 30 extending along a column direction and a plurality of second power lines 40 extending along a row direction, where each of the plurality of first power lines is electrically connected to a plurality of the sub-pixels arranged along the column direction, and the plurality of first power lines 30 and the plurality of second power lines 40 have perpendicular projections respectively on a top surface of the base substrate, where the perpendicular projections form overlapping regions, and the plurality of first power lines and the plurality of second power lines are electrically connected in the overlapping regions. The display panel 100 further includes a plurality of connection units 50, where a first end of each of the plurality of connection units 50 is electrically connected to the power bus 20, a second end of the each of the plurality of connection units 50 is electrically connected to one of the plurality of first power lines 30 or one of the plurality of second power lines 40, and vertical projections of the second ends of the plurality of connection units 50 on a top surface of the base substrate 10 is located do not overlap one another, where the difference of the electrical resistance between any two of the plurality of connection units 50 is within a preset range.

In the embodiment, the connection units 50 are configured, where the first end of each connection unit 50 is electrically connected to the power bus 20, the second end of the each connection unit 50 is electrically connected to one first power line 30 or one second power line 4. Compared with in the related art in which the power bus is directly connected to the power lines, in the embodiment, the power voltage on the power bus 20 is acquired through the plurality of connection units 50, and then the acquired power voltages are transmitted to the first power lines 30 or the second power lines 40. Further, since the difference of the electrical resistance between any two of the plurality of connection units 50 is within the preset range, that is, the difference of the electrical resistance between any two of the plurality of connection units 50 is relative small, in a case where respective connection units 50 acquire the power voltage of the power bus 20, the voltage drops after passing through the respective connection units 50 are basically the same, that is, voltage signals at the second ends of the plurality of connection units 50 are basically the same. In this case, when the second ends of the plurality of connection units 50 are electrically connected to the first power lines 30 or the second power lines 40, the first power lines 30 or the second power lines 40 acquire a plurality of basically identical power voltages. That is, compared with in the related art in which the power bus directly provides the power voltage to the power lines, in the embodiment, the second end of each connection unit 50 is a point contact source, which is a structure supplying a power voltage to the first power lines 30 or the second power lines 40. Each point contact source supplies a power voltage to sub-pixels around the point contact source, which is equivalent to the display panel 100 being divided into a plurality of small panels, and each point contact source is responsible for a small region. Therefore, the drop amplitude of the power voltage in the small region is reduced, and the uniformity of the display panel 100 as a whole is improved.

In addition, in the embodiment, the power lines are configured as the first power lines 30 extending along the column direction and the second power lines 40 extending along the row direction to form a grid shape, so that the power lines have a smaller resistance, and the display non-uniformity due to the voltage drops of the power lines is improved. At the same time, since the second power lines 40 are connected to each of the first power lines 30 in the row direction, the power signals acquired by the respective sub-pixels in the row direction are more uniform, thereby further improving the display uniformity of the display panel 100.

Optionally, the material of the connection units 50 may be, for example, a material having a low resistivity, or may be, for example, a metal material such as aluminum or silver. However, the present embodiment is not limited to this, and those skilled in the art may select the material according to the practical situations, as long as the difference of the electrical resistance between any two of the plurality of connection units 50 is within the preset range.

Optionally, the material of the plurality of connection units may be the same or different. In a case where the plurality of connection units 50 have a same material, a same length and a same cross-sectional area, the design is simple, the process steps are simplified, and the preparation efficiency of the display panel 100 is improved.

Optionally, a difference of an electrical resistance between any two of the plurality of connection units 50 is 0. In a case where the difference of the electrical resistance between any two of the plurality of connection units 50 is 0, the plurality of power voltages acquired by the first power lines 30 or the second power lines 40 are the same, and when each power voltage supplies a power voltage to its surrounding sub-pixels, the power voltages acquired by the sub-pixels are basically the same, thus improving the display uniformity.

It is to be noted that the second end of each connection unit 50 may be electrically connected to one first power line 30, or may be electrically connected to one second power line 40, which is not limited in the embodiment, as long as the power voltages may be transmitted to the sub-pixels through the first power lines 30 or the second power lines 40. FIG. 2 will only be described with an example of the second ends of the connection units 50 being electrically connected to the first power lines 30.

It is to be noted that when it is determined that the difference of the electrical resistance between any two of the plurality of connection units 50 is within the preset range, for example, the resistance of each connection unit 50 may be directly measured by an instrument such as a multimeter to control the difference of the electrical resistance between any two of the plurality of connection units 50 to be within the preset range. Alternatively, according to a resistance formula $R=\rho l/s$, where R is the resistance of the connection unit 50, $\rho$ is the resistivity of the connection unit 50, l is the length of the connection unit 50, s is the cross-sectional area of the connection unit 50 and is a product of the thickness and the width of the connection unit 50, it can be seen that if each connection unit 50 is prepared by the same process and the same material, since the thickness of each connection unit 50 and the resistivity of each connection unit 50 are the same, the difference of the electrical resistance between any two of the connection units 50 can be controlled within the preset range only by controlling the lengths and the widths of the connection units 50.

In conclusion, the display panel provided in the embodiment includes the plurality of connection units, the power voltages acquired from the power bus are transmitted to the first power lines or the second power lines through the plurality of connection units, and since the difference of the electrical resistance between any two of the plurality of connection units is relative small, the power voltages transmitted by the plurality of connection units to the first power lines or the second power lines are basically the same, that is, each connection unit only needs to provide a power voltage to sub-pixels in a region to adjacent to the each connection unit through the first power lines or the second power lines, thus reducing the drop amplitude of the power voltage in the small region and improving the uniformity of the display panel as a whole.

Figure 3:
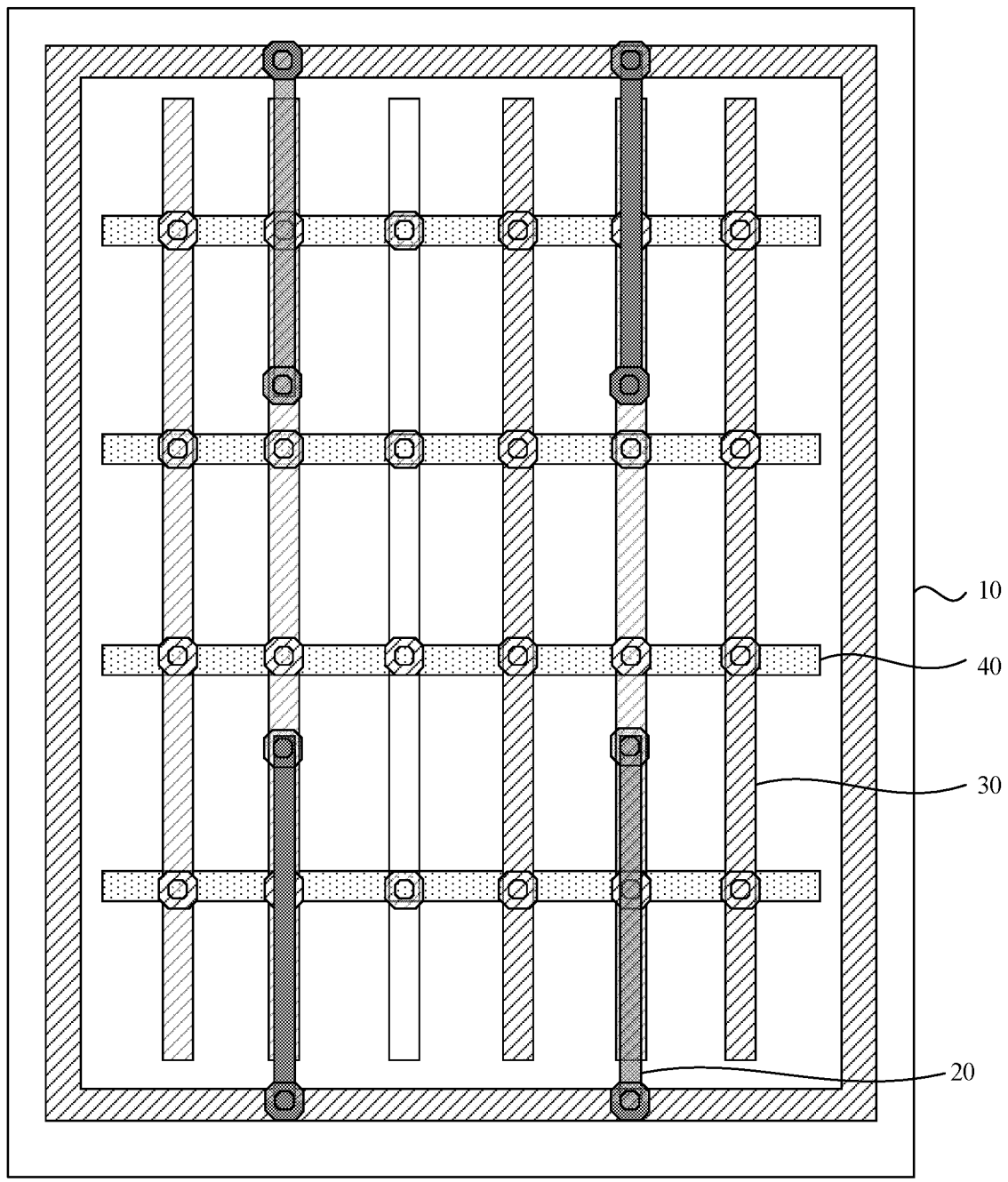
FIG. 3 is a structural diagram of another display panel according to an embodiment of the present disclosure.

Optionally, FIG. 3 is a structural diagram of another display panel according to an embodiment of the present disclosure. As shown in FIG. 3, a vertical projection of each connection unit 50 on the top surface of the base substrate 10 is located is located within a vertical projection of one first power line 30 and/or one second power line 40 on the top surface of the base substrate 10 is located.

An advantage of such configuration is that in a case where the display panel 100 adopts bottom emission, the connection units 50 are prevented from blocking light, and the aperture ratio of each sub-pixel in the display panel 100 is increased.

Figure 4:
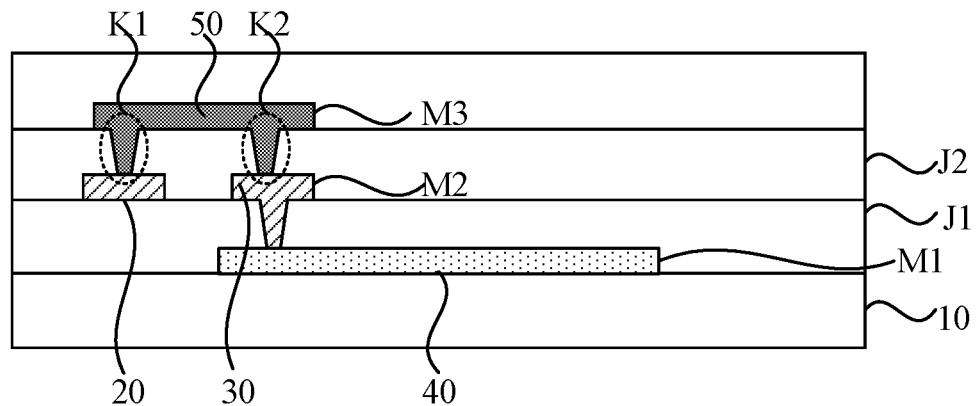
FIG. 4 is a schematic diagram of a film structure of a display panel according to an embodiment of the present disclosure.

Optionally, FIG. 4 is a schematic diagram of a film structure of a display panel according to an embodiment of the present disclosure. As shown in FIG. 4, the display panel 100 further includes a first metal layer M1, a first insulating layer J1, a second metal layer M2, a second insulating layer J2 and a third metal layer M3 which are disposed in sequence on the top surface of base substrate. The plurality of second power lines 40 are disposed in the first metal layer M1, the power bus 20 and the plurality of first power lines 30 are disposed in the second metal layer M2, and the plurality of connection units 50 are disposed in the third metal layer M3, where the first end of each connection unit 50 is electrically connected to the power bus 20 through the first via K1, and the second end of each connection unit 50 is electrically connected to one first power line 30 or one second power line 40 through the second via K2.

It is to be understood by those skilled in the art that in order to facilitate the explanation of the film layer relationship of each structure, FIG. 4 simply shows relative location relationships of the first power lines 30, the second power lines 40, the connection unit 50*s* and the power bus 20.

In the embodiment, the connection units 50 are provided in the third metal layer M3, so that the influence of static electricity in a film layer on a side, facing away from the base substrate 10, of the third metal layer M3 on a structure of a side, facing toward from the base substrate 10, of the third metal layer M3 can be shielded. For example, the influence of static electricity in the film layer on the side, facing away from the base substrate 10, of the third metal layer M3 on a thin film transistor of the side, facing toward from the base substrate 10, of the third metal layer M3 can be shielded. In addition, the power bus 20 and the first power lines 30 are provided on a same layer, which can simplify the process steps and improve the preparation efficiency of the display panel 100.

It is to be noted that FIG. 4 is illustrative only with the connection units 50 located in the third metal layer M3 as an example, which does not limit the present disclosure, and those skilled in the art may set according to the practical situations. In another optional embodiment, the connection units 50 may further be provided in the second metal layer M2, or in the first metal layer M1, as long as the power bus 20 is electrically connected to the first power lines 30 or the second power lines 40 through the connection units 50.

It is to be noted that FIG. 4 is illustrative only with the power bus 20 and the first power lines 30 provided on the same layer as an example, but a specific location of the power line 20 is not limit, as long as a power signal sent by a driving chip can be received. For example, the power bus 20 and the connection units 50 are located in the third metal layer M3. Also for example, the power bus 20 is located in both the second metal layer M2 and the third metal layer M3, so that the resistance of the power bus 20 can be reduced.

Optionally, referring to FIG. 4, the second insulating layer J2 includes an organic insulating layer.

The second insulating layer J2 includes the organic insulating layer, so that the coupling capacitance between the connection units 50 and the power bus 20 and/or the first power lines 30 in the second metal layer M2 is reduced, and the display effect of the display panel 100 is improved. The second insulating layer may include both an inorganic layer and an organic layer. In a case where projection regions of the connection lines overlap fixed potential signal lines, the second insulating layer may be the inorganic layer; and in a case where projection regions of the connection lines exceed projection regions of the first power lines and projection regions of the second power lines, and cover non-fixed potential lines (such as scanning lines and data lines), the second insulating layer preferably includes the organic layer to reduce stray capacitance and delay of alternating current (AC) signals.

Figure 5:
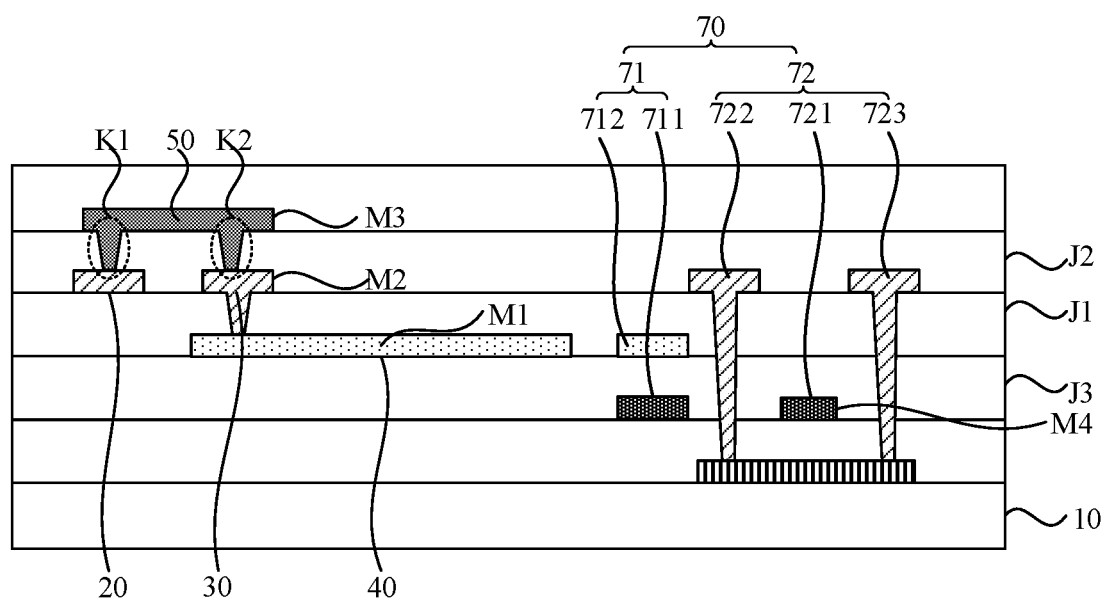
FIG. 5 is a schematic diagram of a film structure of another display panel according to an embodiment of the present disclosure.

Based on the above the solution, optionally, FIG. 5 is a schematic diagram of a film structure of another display panel according to an embodiment of the present disclosure. As shown in FIG. 5, each sub-pixel includes a light-emitting element and a driving circuit 70, the driving circuit 70 includes a storage capacitance 71 and at least one thin film transistor 72, the storage capacitance 71 includes a first electrode 711 and a second electrode 712, and each thin film transistor 72 includes a gate 721, a source 722 and a drain 723. The display panel 100 further includes a fourth metal layer M4 located between the first metal layer M1 and the base substrate 10, where the fourth metal layer M4 includes the first electrode 711 and the gate 721.

In a case where the display panel 100 includes the fourth metal layer M4, the connection units 50 may further be located in the fourth metal layer M4, that is, the fourth metal layer M4 includes the first electrode 711, the gate 721 and the connection units 50, which can simplify the process steps.

Figure 6:
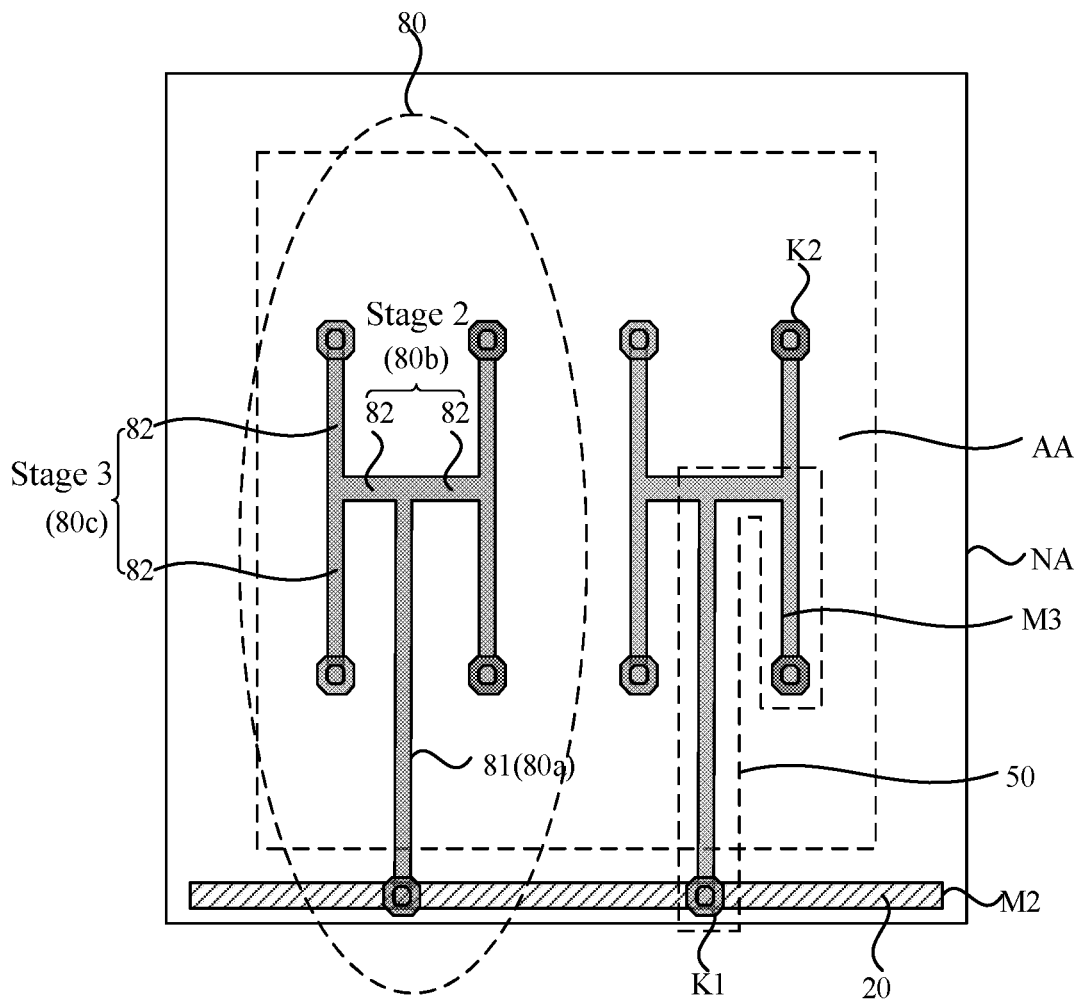
FIG. 6 is a structural diagram of another display panel according to an embodiment of the present disclosure.

Optionally, FIG. 6 is a structural diagram of another display panel according to an embodiment of the present disclosure. As shown in FIG. 6, the display panel further includes a display region AA and a non-display region NA, where the power bus 20 is located in the non-display region NA, and the power bus 20 partially surrounds the display region AA. The third metal layer M3 includes a patterned structure, and the patterned structure includes at least one first branch 80 of stages 1 to N. In each first branch 80 of stages 1 to N, a first branch of stage 1 includes one first connection sub-unit 81, and each first branch of each of stages 2 to N includes two second connection sub-units 82 with opposite extension directions and same length. A first end of the first connection sub-unit 81 is electrically connected to the power bus 20 through the first via K1, and a second end of the first connection sub-unit 81 is electrically connected to first ends of two second connection sub-units 82 of a first branch of stage 2 separately. A second end of each of two second connection sub-unit 82 of each first branch of stage i is electrically connected to first ends of two second connection sub-units 82 of a respective first branch of stage i+1 separately, a second end of each second connection sub-unit 82 of a first branch of stage N−1 is electrically connected to first ends of the two second connection sub-units 82 of a respective first branch of stage N separately, and a second end of each second connection sub-unit 82 of the respective first branch of stage N is electrically connected to one first power line or one second power line through the second via K2. N and i are both positive integers, and N≥3, 2≤i≤N−1. Each connection unit 50 includes the first connection sub-unit 81 and second connection sub-units 82 in stages 2 to N, where the number of the second connection sub-units of each stage is 1.

It is to be noted that in order to clearly show a structure of a connection unit 50, FIG. 6 only shows the connection unit 50, but does not show the first power lines and the second power lines, which goes the same in the following embodiments, and will not be discussed further in the following embodiments.

Exemplarily, referring to FIG. 6, N is equal to 3, and the number of first branches is 2, that is, the patterned structure includes two first branches 80, and each first branch includes stages 1 to 3. Specifically, in each first branch 80, a first branch 80a of stage 1 includes one first connection sub-unit 81, a first branch 80b of stage 2 includes two second connection sub-units 82 with opposite extension directions and having the same length, and each first branch 80c of stage 3 includes two second connection sub-units 82 with opposite extension directions and having the same length. The first end of the first connection sub-unit 81 is electrically connected to the power bus 20 through the first via K1, and the second end of the first connection sub-unit 81 is electrically connected to a first end of each second connection sub-unit 82 of the first branch 80b of stage 2. A second end of each second connection sub-unit 82 of the first branch 80b of stage 2 is electrically connected to first ends of two second connection sub-units 82 of a respective first branch 80c of stage 3, and a second end of the two second connection sub-units 82 of the respective first branch 80c of stage 3 is electrically connected to one first power line or one second power line through the second via K2. Each connection unit 50 includes the first connection sub-unit 81, one second connection sub-unit 82 in stage 2 and one second connection sub-unit 82 in stage 3. That is, one first branch 80 includes 4 connection units 50. In a case where the patterned structure includes two first branches 80 of stages 1 to 3, the two first branches include 8 connection units 50. The power voltage acquired by each connection unit 50 is transmitted to the first power line or the second power line through the second via K2, that is, each second via K2 is a point contact source. Each point contact source supplies a power voltage to sub-pixels around the point contact source, which is equivalent to the display panel being divided into 8 small regions, and each point contact source is responsible for providing the power voltage to the sub-pixels in one small region, thus reducing the drop amplitude of the power voltage in the small region and improving the uniformity of the display panel as a whole. In addition, the connection units 50 are formed by providing branches, thus reducing wiring of the connection units 50 and simplifying process steps.

Figure 7:
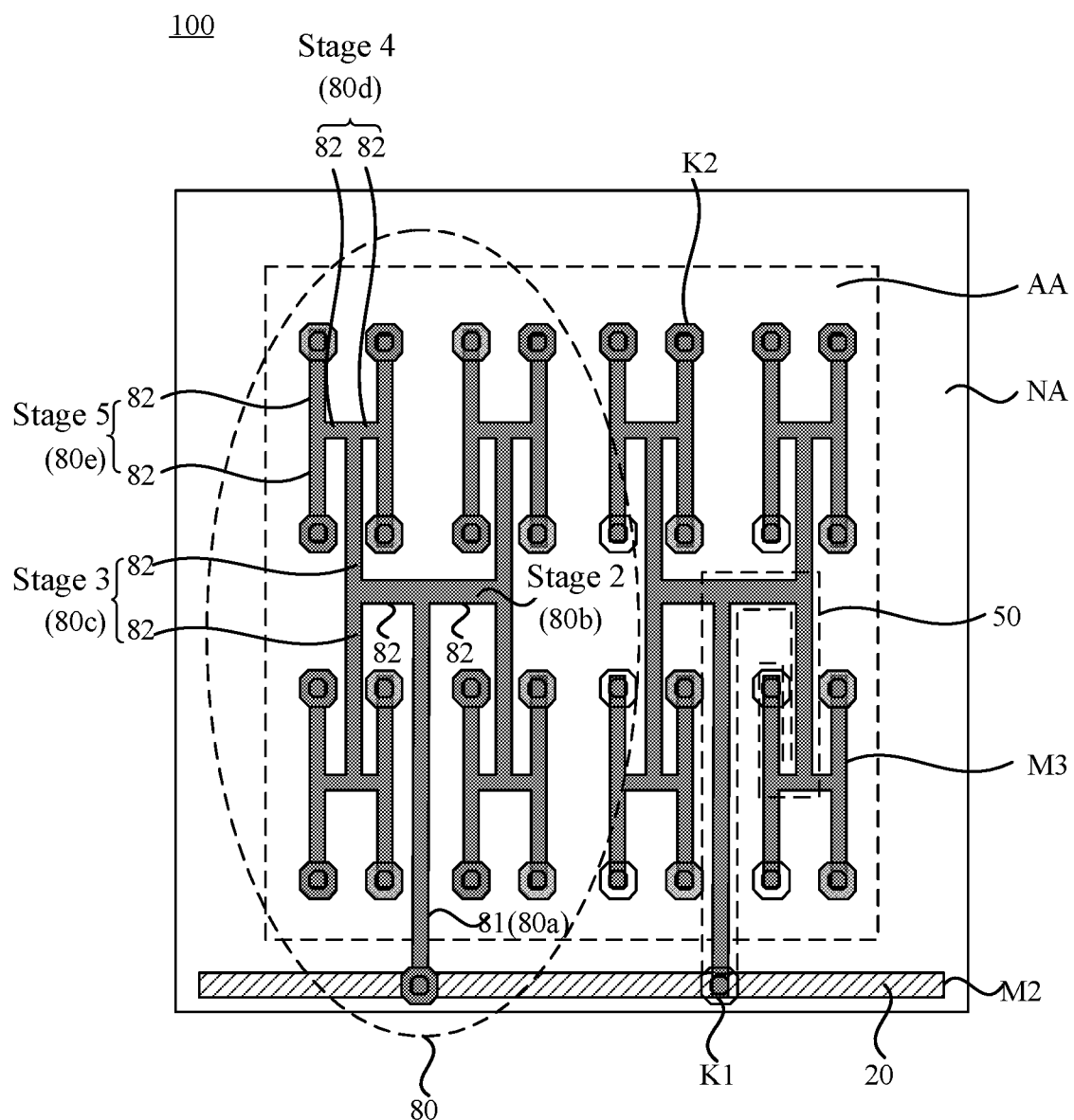
FIG. 7 is a structural diagram of another display panel according to an embodiment of the present disclosure.

Exemplarily, FIG. 7 is a structural diagram of another display panel according to an embodiment of the present disclosure. As shown in FIG. 7, N is equal to 5, and the number of the first branches 80 is 2, that is, the patterned structure includes two first branches 80, and each first branch 80 includes stages 1 to 5. Specifically, in each first branch 80, a first branch 80*a* of stage 1 includes one first connection sub-unit 81, a first branch 80*b* of stage 2 includes two second connection sub-units 82 with opposite extension directions and having the same length, each first branch 80*c* of stage 3 includes two second connection sub-units 82 with opposite extension directions and having the same length, each first branches 80*d* of stage 4 includes two second connection sub-units 82 with opposite extension directions and having the same length, and each first branch 80*e* of stage 5 includes two second connection sub-units 82 with opposite extension directions and having the same length. The first end of the first connection sub-unit 81 is electrically connected to the power bus 20 through the first via K1, and the second end of the first connection sub-unit 81 is electrically connected to the first end of each second connection sub-unit 82 of a first branch 80*b* of stage 2. A second end of each second connection sub-unit 82 of the first branch 80*b* of stage 2 is electrically connected to first ends of two second connection sub-units 82 of a respective first branch 80*c* of stage 3 separately, a second end of each second connection sub-unit 82 of the respective first branch 80*c* of stage 3 is electrically connected to first ends of two second connection sub-units 82 of a respective first branch 80*d* of stage 4 separately, a second end of each second connection sub-unit 82 of the respective first branch 80*d* of stage 4 is electrically connected to first ends of two second connection sub-units 82 of a first branch 80*e* of stage 5 separately, and a second end of each second connection sub-unit 82 of the respective first branch 80*e* of stage 5 is electrically connected to one first power line or one second power line through the second via K2. Each connection unit 50 includes the first connection sub-unit 81, one second connection sub-unit 82 in stage 2, one second connection sub-unit 82 of stage 3, one second connection sub-unit 82 in stage 4 and one second connection sub-unit 82 in stage 5. That is, one first branch 80 includes sixteen connection units 50. In a case where the patterned structure includes two first branches of stages 1 to 5, the two first branches include thirty-two connection units 50. The power voltage acquired by each connection unit 50 is transmitted to the first power line or the second power line through the second via K2, that is, each second via K2 is a point contact source. Each point contact source provides the power voltage to sub-pixels around the point contact source, which is equivalent to the display panel being divided into sixteen small regions, and each point contact source is responsible for providing the power voltage to the sub-pixels in one small region, thus reducing the drop amplitude of the power voltage in the small region and improving the overall uniformity of the display panel. In addition, the connection units 50 are formed by providing branches, thus reducing wiring of the connection units 50 and simplifying process steps.

In addition, as can be seen from FIGS. 6 and 7, in a case where the number of stages of the first branch 80 increases, the number of connection units 50 increases and the number of point contact sources increases, so that a region where each point contact source supplies a power voltage to the plurality of sub-pixels is reduced, the amplitude drop of the power voltage in the relative small region further decreases, and the uniformity of the display panel as a whole is improved.

It is to be noted that the above examples are illustrated using an example of two first branches 80 of stages 1 to 3 and two first branches 80 of stages 1 to 5, which does not limit the present disclosure, and those skilled in the art may set according to the practical situations.

Figure 8:
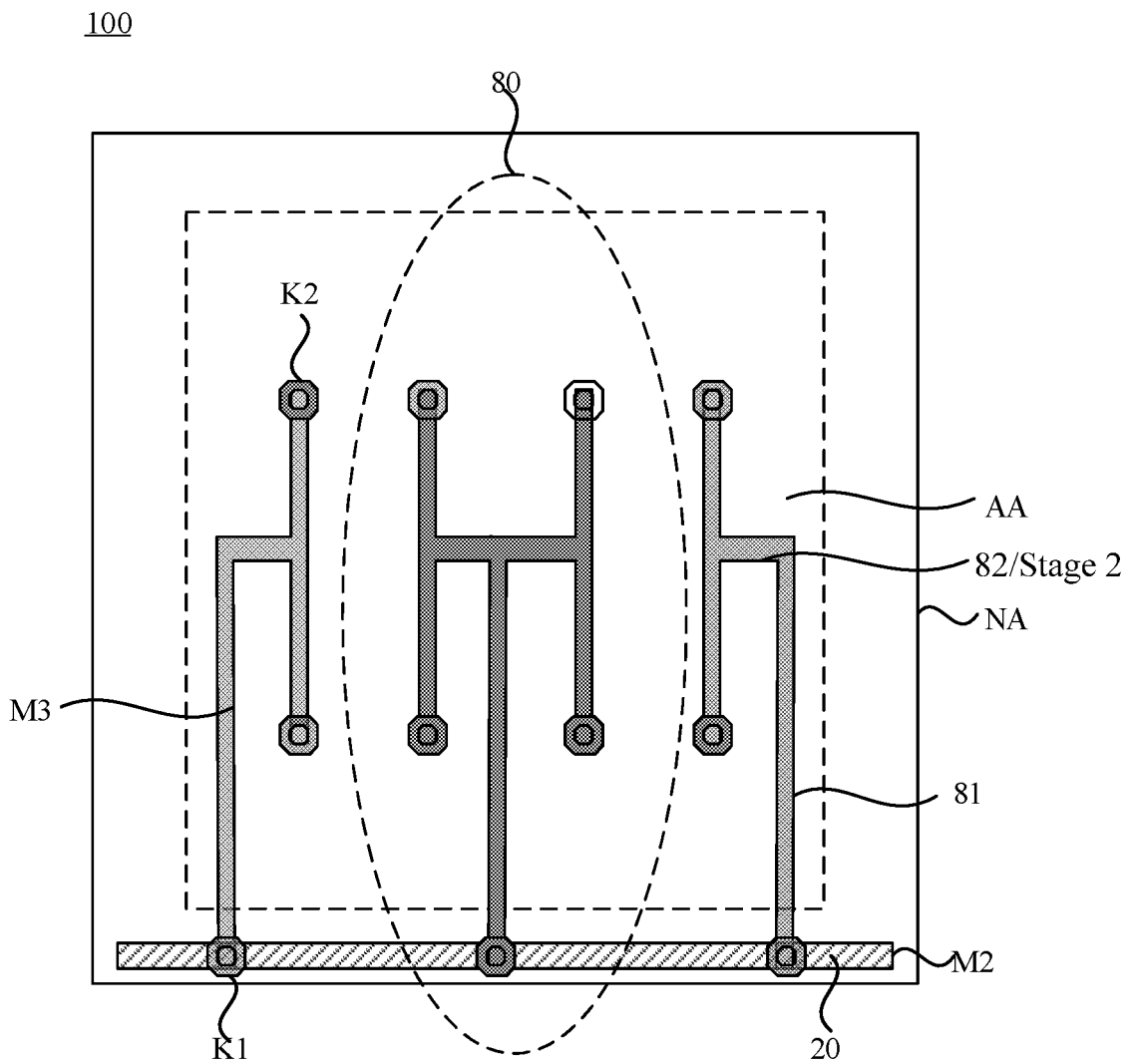
FIG. 8 is a structural diagram of another display panel according to an embodiment of the present disclosure.
Figure 9:
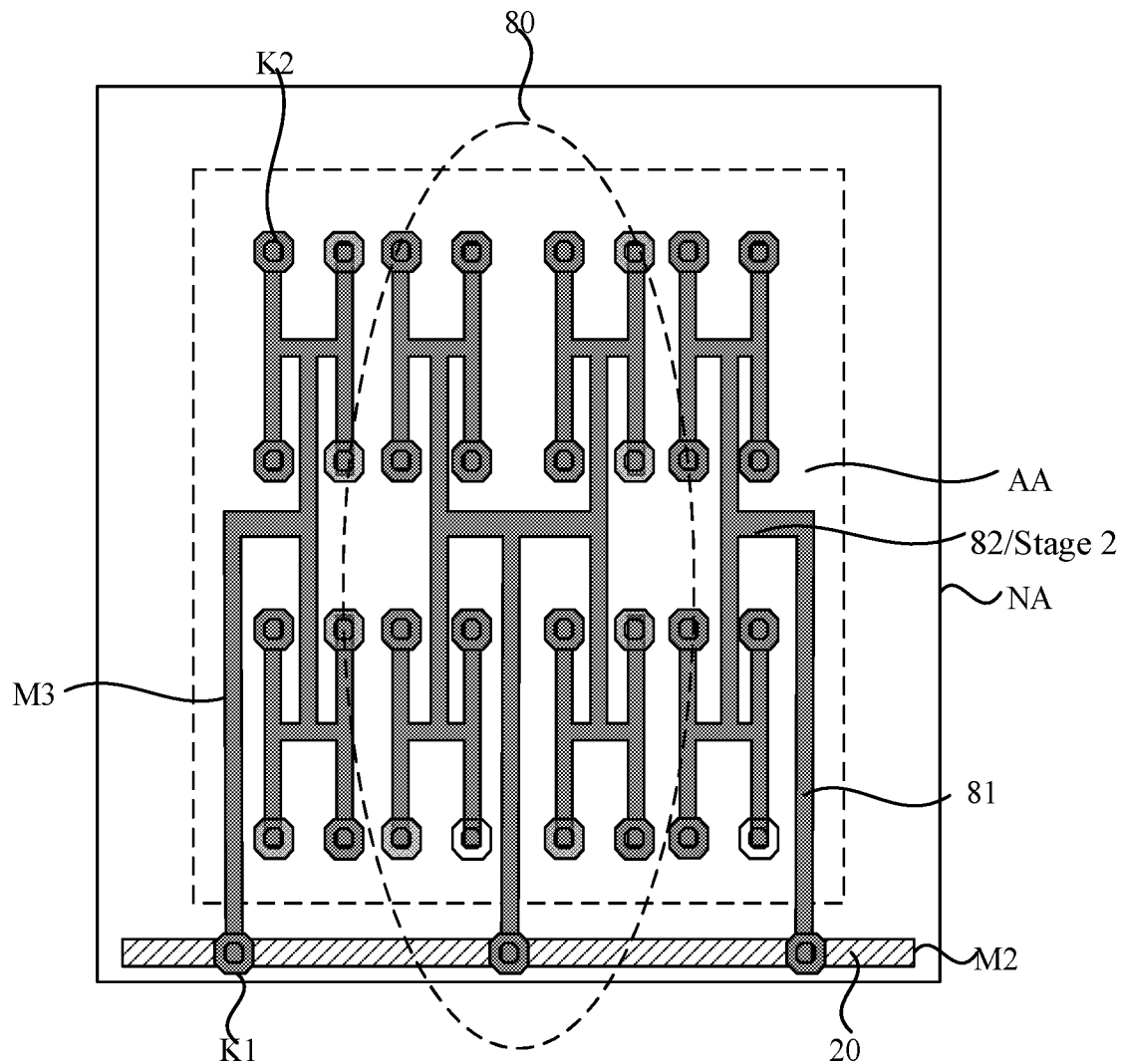
FIG. 9 is a structural diagram of another display panel according to an embodiment of the present disclosure.

It is to be understood that in a case where the patterned structure includes a plurality of first branches 80, a first branch 80*b* of stage 2 in each of two first branch 80 located in opposite sides, close to the non-display region NA, of the display region AA may also include only one second connection sub-unit 82, and an extension direction of the second connection sub-unit 82 is a direction from the non-display region NA to the display region AA, referring to, for example, FIGS. 8 and 9. The present embodiment does not limit the number of second connection sub-units 82 in the first branch 80*b* of stage 2 in each of the two first branch 80 located on opposite sides of the display region AA close to the non-display region NA, that is, the number of second connection sub-units 82 in the first branch 80*b* of stage 2 may be 2, as seen in FIGS. 6 and 7, or may also be 1, as also seen in FIGS. 8 and 9, and those skilled in the art may set the number according to the practical situations.

Figure 10:
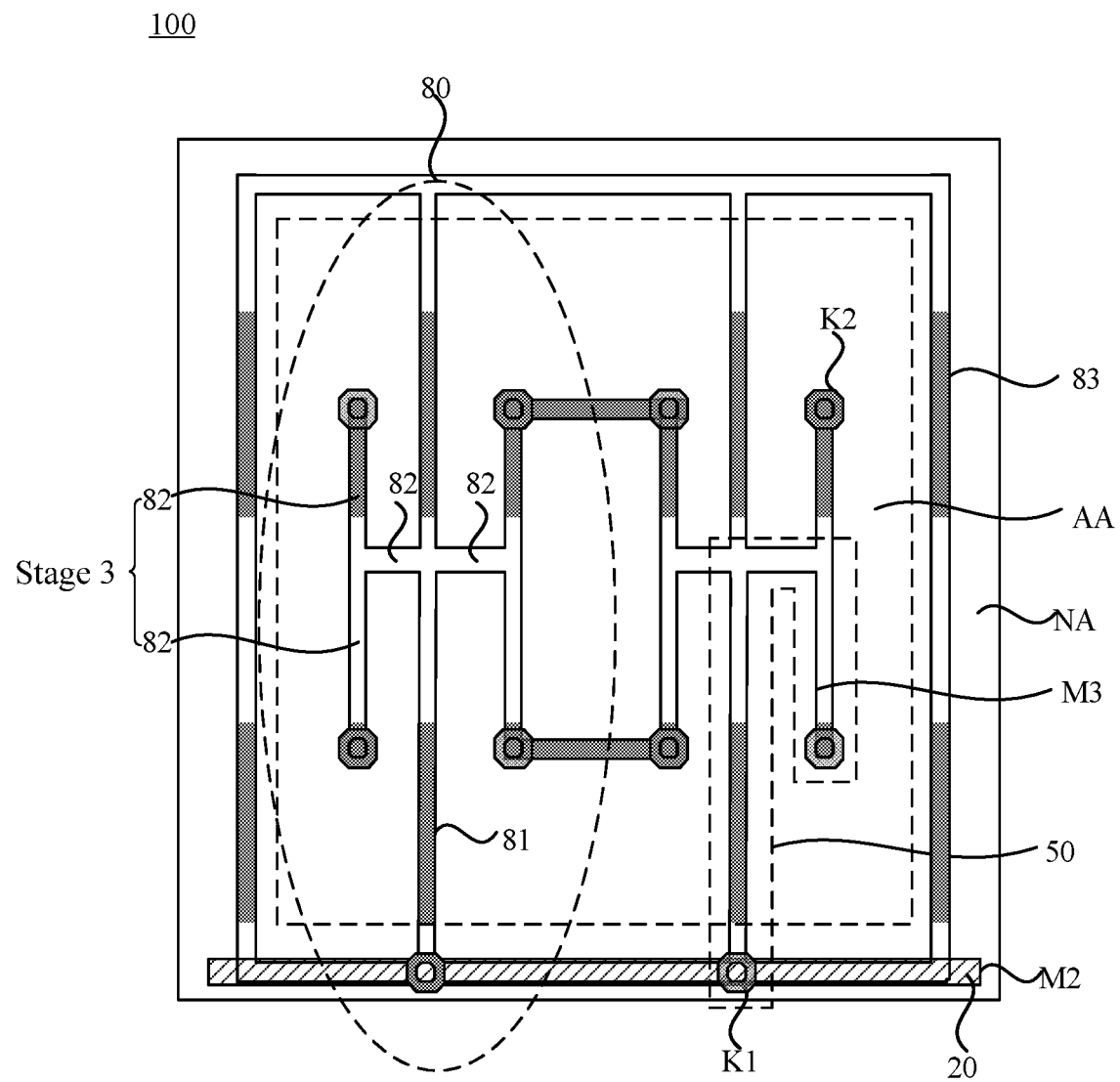
FIG. 10 is a structural diagram of another display panel according to an embodiment of the present disclosure.

Optionally, FIG. 10 is a structural diagram of another display panel according to an embodiment of the present disclosure, and as shown in FIG. 10, the second ends of second connection sub-units 82 of a part of the first branches 80 of stage N are electrically connected, where the part of the first branches of stage N are adjacent and connected to respective different first branches of stage N−1.

Considering that there may still be signal differences among the connection units 50, the second ends of second connection sub-units 82 of the first branches 80 of the stage 1 that are unconnected and adjacent are electrically connected in the embodiment, so that the uniformity of the signals of various connection units 50 can be achieved, and when the connection units 50 transmit power signals to the first power lines or the second power lines through the second vias K2, the transmitted power signals are the same, thus further improving the display uniformity of the display panel.

Optionally, referring to FIG. 10, the patterned structure includes a connection collar 83, the connection collar 83 is electronically connected to the first vias K1, and the second ends of the first connection sub-units 81 extend to the connection collar 83.

In the embodiment, the first vias K1 are electrically connected through the connection collar 83 so that the power voltages acquired from the power bus 20 may be uniform. In addition, the second ends of the first connection sub-units 81 extend to the connection collar 83 so that the power voltage signals transmitted by the connection units 50 are uniform. When the connection units 50 transmits power signals to the first power lines or the second power lines through the second vias K2, the transmitted power signals are the same so that the display uniformity of the display panel is further improved.

Figure 11:
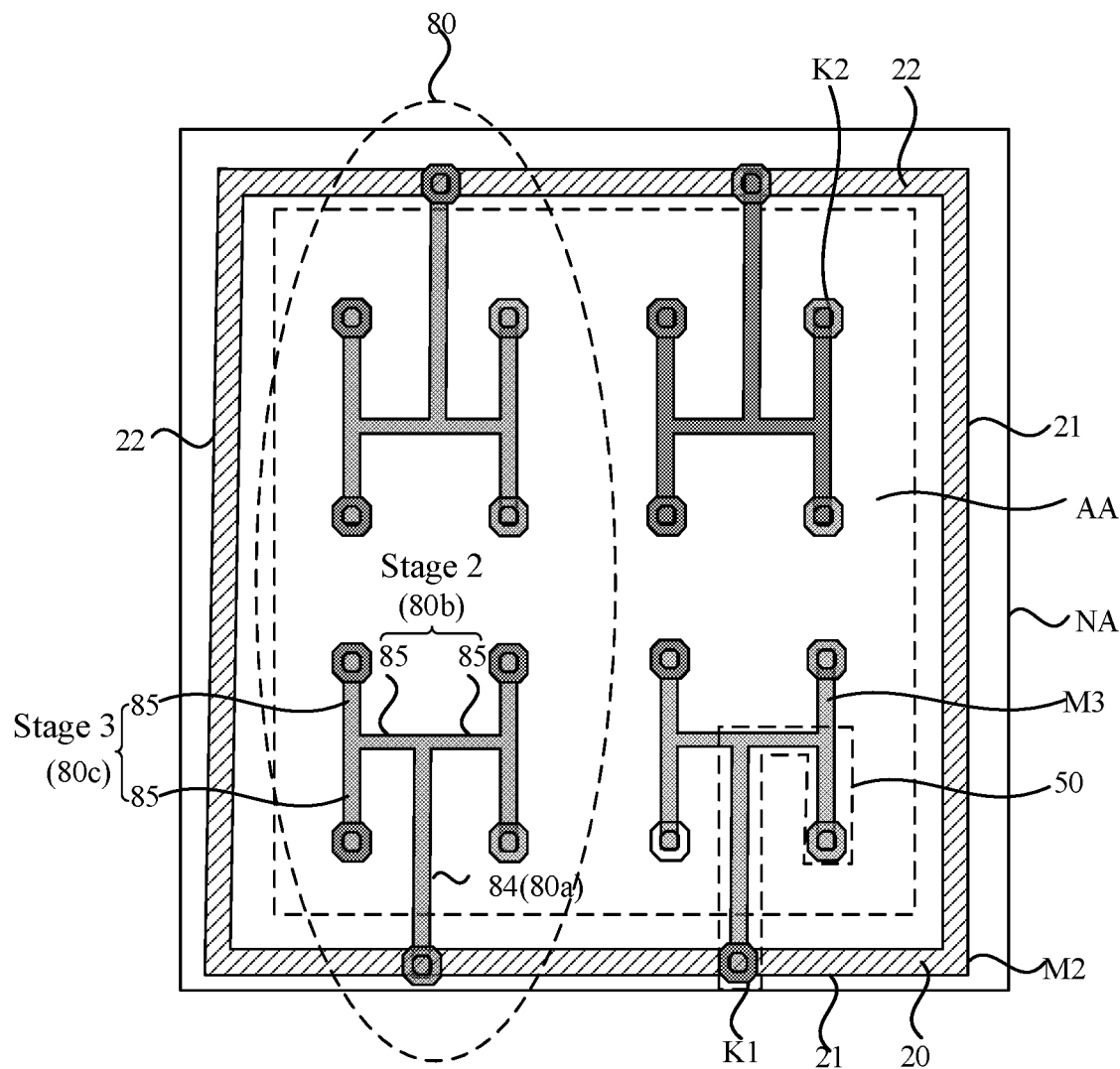
FIG. 11 is a structural diagram of another display panel according to an embodiment of the present disclosure.

Optionally, FIG. 11 is a structural diagram of another display panel according to an embodiment of the present disclosure. As shown in FIG. 11, the display panel 100 further includes a display region AA and a non-display region NA, where the power bus 20 is located in the non-display region NA, and the power bus 20 encircles the display region AA. The third metal layer M3 includes a patterned structure, and the patterned structure includes at least one first branch 80 of stages 1 to N. In each first branch 80 of stages 1 to N, a first branch 80 of stage 1 includes two third connection sub-units 84, and each first branch 80 of each of stages 2 to N includes two of the fourth connection sub-units 85 with opposite extension directions and having the same length. First ends of the two third connection sub-units 84 are electrically connected to opposite sides of the power bus 20 through the first vias K1, and a second end of each of the two third connection sub-units 84 is electrically connected to first ends of the two fourth connection sub-units 85 of a respective first branch 80 of stage 2 separately. A second end of each of the two fourth connection sub-units 85 of the respective first branch 80 of stage i is electrically connected to a first end of each of the two fourth connection sub-units 85 of a respective first branch 80 of stage i+1. A second end of each of the two fourth connection sub-units 85 of a first branch 80 of stage N−1 is electrically connected to first ends of the two fourth connection sub-units 85 of a respective first branch 8 of stage N separately, and a second end of each of the two fourth connection sub-units 85 of the respective first branch 80 of stage N is electrically connected to one first power line or one second power line through the second via K2. N and i are both positive integers, and N≥3, 2≤i≤N−1. Each connection units 50 include a third connection sub-unit 84 and fourth connection sub-units 85 of stages 2 to N, and the number of third connection sub-units 84 and the number of fourth connection sub-units 85 of each stage are 1.

Exemplarily, referring to FIG. 11, N is equal to 3, and the number of the first branches 80 is 2, that is, the patterned structure includes two first branches 80, each first branch 80 includes stages 1 to 3. Specifically, in each first branch 80, a first branch 80a of stage 1 includes two third connection sub-units 84, each first branch 80b of stage 2 includes two of the fourth connection sub-units 85 with opposite extension directions and having the same length, and each branch 80c of stage 3 includes two of the fourth connection sub-units 85 with opposite extension directions and having the same length. The power bus 20 encircles the display region AA, that is, the power bus 20 includes two sets of first edges 21 and second edges 22 which are opposite. First ends of the two third connection sub-units 84 are electrically connected to a first edge 21 of the power bus 20 and a second edge 22 of the power bus 20 through the first vias K1 respectively, and a second end of each of the two third connection sub-units 84 is electrically connected to first ends of two fourth connection sub-units 85 of a respective first branch 80b of stage 2 separately. A second end of each of the two fourth connection sub-units 85 of the respective first branch 80b of stage 2 is electrically connected to first ends of two fourth connection sub-units 85 of a respective first branch 80c of stage 3 separately, a second end of each of the two fourth connection sub-units 85 of the respective first branch 80c of stage 3 is electrically connected to one first power line or one second power line through the second via K2. Each connection unit 50 includes one third connection sub-unit 84, one fourth connection sub-unit 85 in stage 2 and one fourth connection sub-unit 85 in stage 3, so that one first branch 80 includes 8 connection units 50. In a case where the patterned structure includes two first branches and each first branch includes stages 1 3, the two first branches totally include 16 connection units 50. The power voltage acquired by the connection units 50 are transmitted to the first power lines or the second power lines through the second vias K2, that is, each second via K2 is a point contact source. Each point contact source supplies the power voltage to sub-pixels around the point contact source, which is equivalent to the display panel being divided into 16 small regions, and each point contact source is responsible for providing the power voltage to the sub-pixels in one small region, thus reducing the drop amplitude of the power voltage in the small regions and improving the uniformity of the display panel as a whole. In addition, the connection units 50 are formed by providing branches, thus reducing wiring of the connection units 50 and simplifying process steps.

Figure 12:
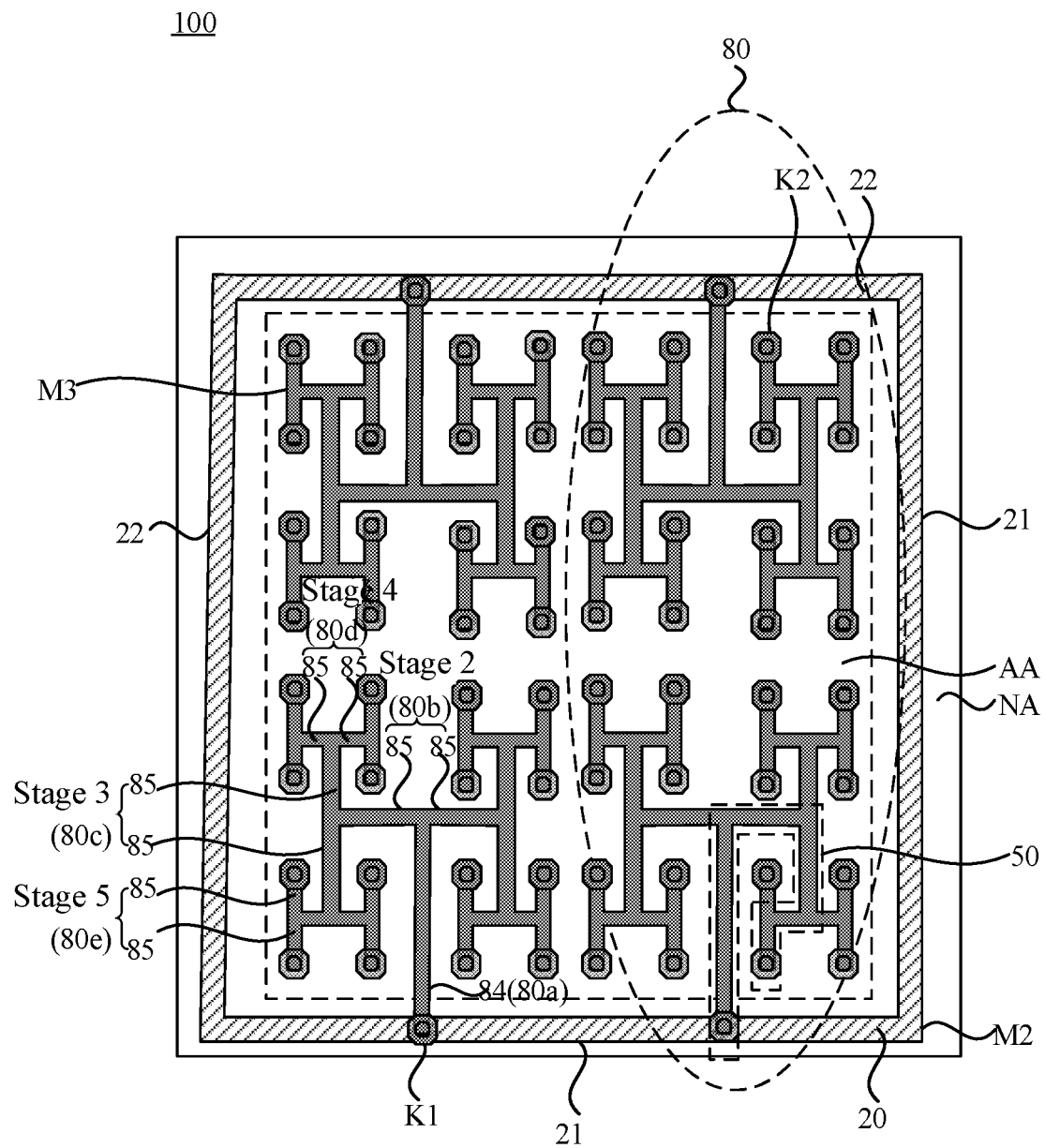
FIG. 12 is a structural diagram of another display panel according to an embodiment of the present disclosure.

Exemplarily, FIG. 12 is a structural diagram of another display panel according to an embodiment of the present disclosure. As shown in FIG. 12, N is equal to 5, and the number of the first branches 80 is 2, that is, the patterned structure includes two first branches 80, and each first branch 80 includes stages 1 to 5. Specifically, in each first branch 80, the first branch 80a of stage 1 includes two third connection sub-units 84, each first branch 80b of stage 2 includes two of the fourth connection sub-units 85 with opposite extension directions and having the same length, each first branch 80c of stage 3 includes two of the fourth connection sub-units 85 with opposite extension directions and having the same length, each first branch 80d of stage 4 includes two of the fourth connection sub-units 85 with opposite extension directions and having the same length, and each first branch 80e of stage 5 includes two of the fourth connection sub-units 85 with opposite extension directions and having the same length. The power bus 20 encircles the display region AA, that is, the power bus 20 includes two sets of first edges 21 and second edges 22 which are opposite. First ends of the two third connection sub-units 84 are electrically connected to the first edge 21 of the power bus 20 and the second edge 22 of the power bus 20 through the first vias K1, respectively, and a second end of each of the two third connection sub-units 84 is electrically connected to first ends of two fourth connection sub-units 20 of a respective first branch 80b of stage 2 separately. A second end of each of the two fourth connection sub-units 85 of the respective first branch 80b of stage 2 is electrically connected to first ends of two fourth connection sub-units 85 of a respective first branch 80c of stage 3 separately, a second end of each of the two fourth connection sub-units 85 of the respective first branch 80c of stage 3 is electrically connected to first ends of two fourth connection sub-units 85 of a respective first branch 80d of stage 4 separately, a second end of each of the two fourth connection sub-units 85 of the respective first branch 80d of stage 4 is electrically connected to first ends of two fourth connection sub-units 85 of a respective first branch 80e of stage 5 separately, and a second end of each of the two fourth connection sub-units 85 of the respective first branch 80e of stage 5 is electrically connected to one first power line or one second power line through the second via K2. Each connection unit 50 includes one third connection sub-unit 84, one fourth connection sub-unit 85 in stage 2, one fourth connection sub-unit 85 in stage 3, one fourth connection sub-unit 85 of stage 4 and one fourth connection sub-unit 85 of stage 5, so that one first branch 80 includes 32 connection units 50. In a case where the patterned structure includes two first branches and each branch includes stages 1 5, the two first branches include 64 connection units 50. The power voltages acquired by the connection units 50 are transmitted to the first power lines or the second power lines through the second vias K2, that is, each second via K2 is a point contact source. Each point contact source supplies a power voltage to sub-pixels around the point contact source, which is equivalent to the display panel being divided into 64 small regions, and each point contact source is responsible for providing the power voltage to the sub-pixels in one small region, thus reducing the drop amplitude of the power voltage in the small region and improving the uniformity of the display panel as a whole. In addition, the connection units 50 are formed by providing branches, thus reducing wiring of the connection units 50 and simplifying process steps.

As can be seen from FIGS. 11 and 12, in a case where the number of stages of the first branch 80 increases, the number of connection units 50 increases and the number of point contact sources increases, so that a region where each point contact source supplies a power voltage to the plurality of sub-pixels is reduced, the drop amplitude of the power voltage in the relative small region further decreases, and the uniformity of the display panel as a whole is improved.

It is to be noted that the above examples are illustrated by way of two first branches 80 of stages 1 to 5 and two first branches 80 of stages 1 to 3, which does not limit the present disclosure, and those skilled in the art may set according to the practical situations.

Figure 13:
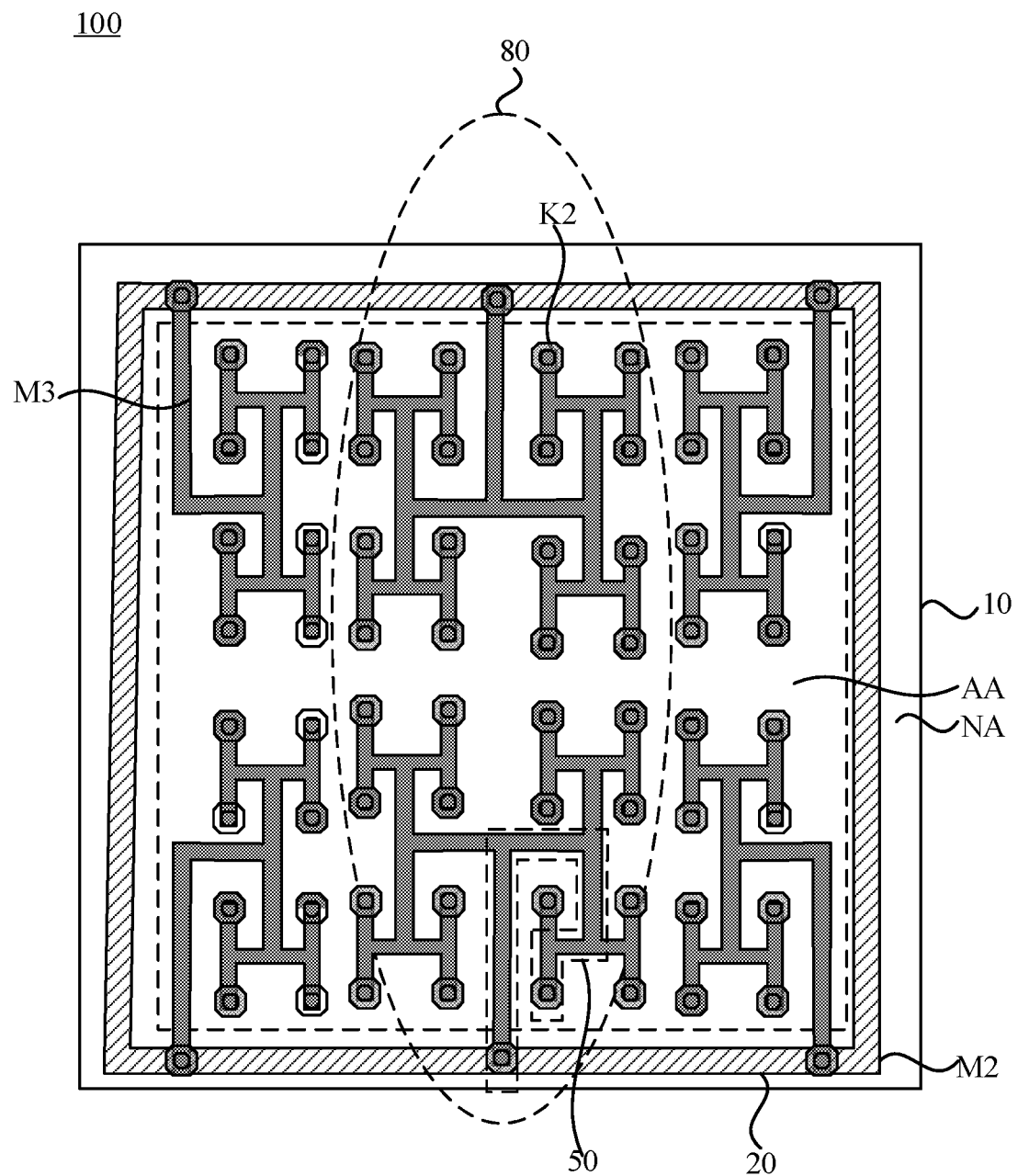
FIG. 13 is a structural diagram of another display panel according to an embodiment of the present disclosure.

It is to be understood that in a case where the patterned structure includes a plurality of first branches 80, a first branch of stage 2 in each of two first branch 80 located on opposite sides, close to the non-display region NA, of the display region AA may also include only one fourth connection sub-unit 85, and an extension direction of the fourth connection sub-unit 85 is a direction from the non-display region NA to the display region AA, referring to, for example, FIG. 13. The present embodiment does not limit the number of fourth connection sub-units 85 in the first branch 80b of stage 2 in each of the two first branches 80 located on opposite sides of the display region AA close to the non-display region NA, that is, the number of fourth connection sub-units 82 in the first branch 80b of stage 2 may be 2, as seen in FIGS. 11 and 12, or may also be 1, as also seen in FIG. 13, and those skilled in the art may set according to the practical situations.

Figure 14:
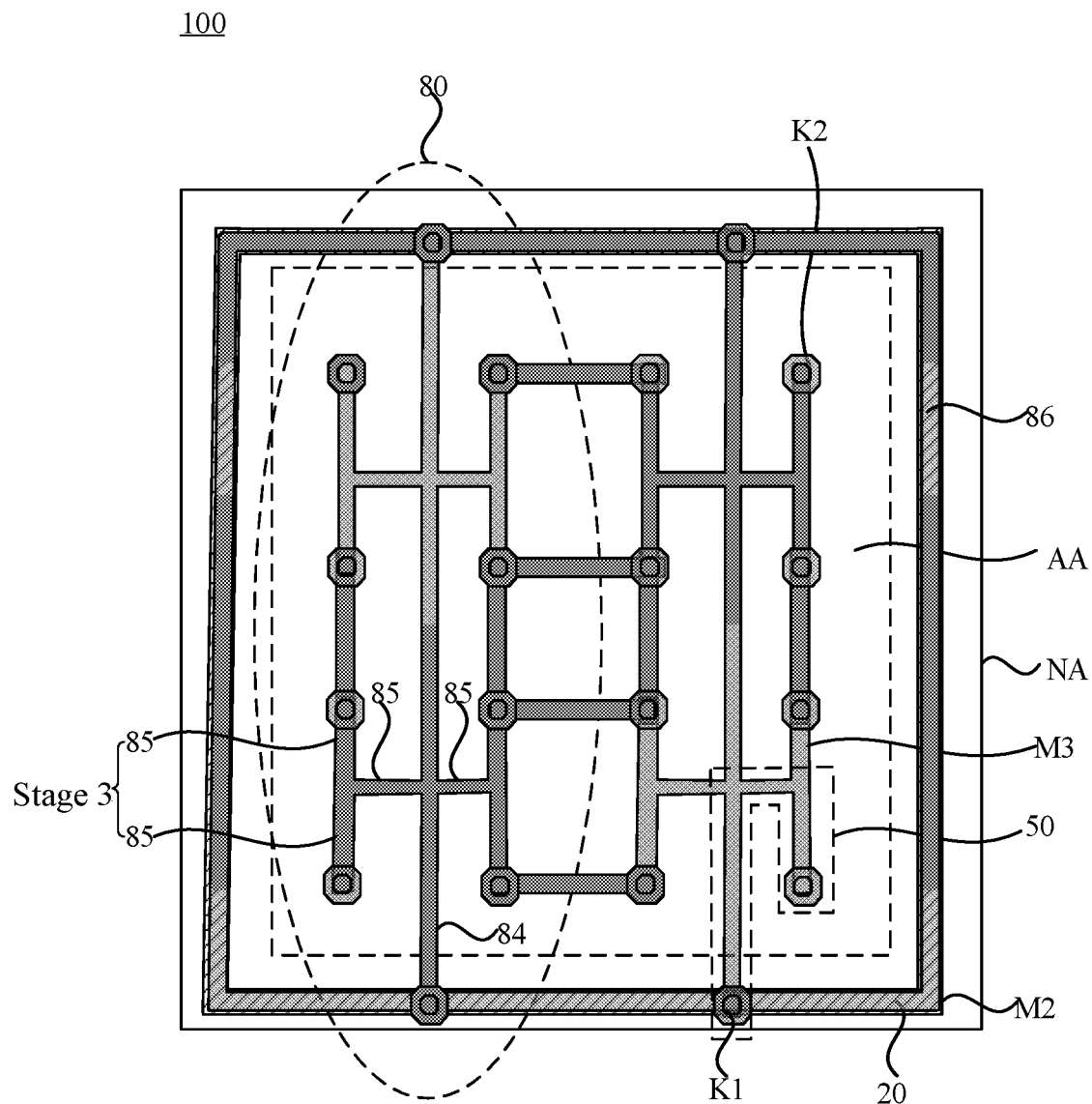
FIG. 14 is a structural diagram of another display panel according to an embodiment of the present disclosure.

Optionally, FIG. 14 is a structural diagram of another display panel according to an embodiment of the present disclosure. As shown in FIG. 14, second ends of fourth connection sub-units 85 of a part of the first branches of stage N are electrically connected, where the part of the first branches of stage N are adjacent and connected to respective different first branches of stage N−1.

The second ends of the fourth connection sub-units 85 of the first branches 80 of stage 1 that are unconnected and adjacent are electrically connected in the embodiment, so that the uniformity of the signals of the connection units 50 can be achieved, and when the connection units 50 transmits power signals to the first power lines or the second power lines through the second vias K2, the transmitted power signals are the same, thus further improving the display uniformity of the display panel.

Optionally, referring to FIG. 14, the patterned structure includes a connection collar 86, the connection collar 86 is electronically connected to the plurality of first vias K1, and the second ends of the third connection sub-units 84 in the same first branch 80 are electrically connected.

In the embodiment, the first vias K1 are electrically connected through the connection collar 86, so that the power voltages acquired from the power bus 20 may be uniform. In addition, the second ends of the third connection sub-units 84 in the same first branch 80 are electrically connected, and the power voltage signals transmitted by the connection units 50 are further uniform. In a case where the connection units 50 transmits power signals to the first power lines or the second power lines through the second vias K2, the transmitted power signals are the same, and the display uniformity of the display panel is further improved.

Optionally, referring to FIGS. 5 and 11, a first branch of each odd stage is in the column direction, and a first branch of each stage is in the row direction.

An advantage of Such configuration is that it is convenient to design and simplify the process steps. At the same time, a vertical projection of each first branch 80 on the top surface of the base substrate 10 is located is located within vertical projections of the first power signal lines and/or the second power lines on the top surface of the base substrate 10 is located, such that in a case where the display panel 100 adopts bottom emission, the aperture ratio of the sub-pixels is improved.

Optionally, referring to FIGS. 5 and 11, a first branch of stage j is axisymmetric about a first branch of stage j−1, where j≥2, so that in a case where the power signals are transmitted in the first branch 80, the uniformity of the power signals transmitted on respective stages in the first branch 80 can be ensured.

Figure 15:
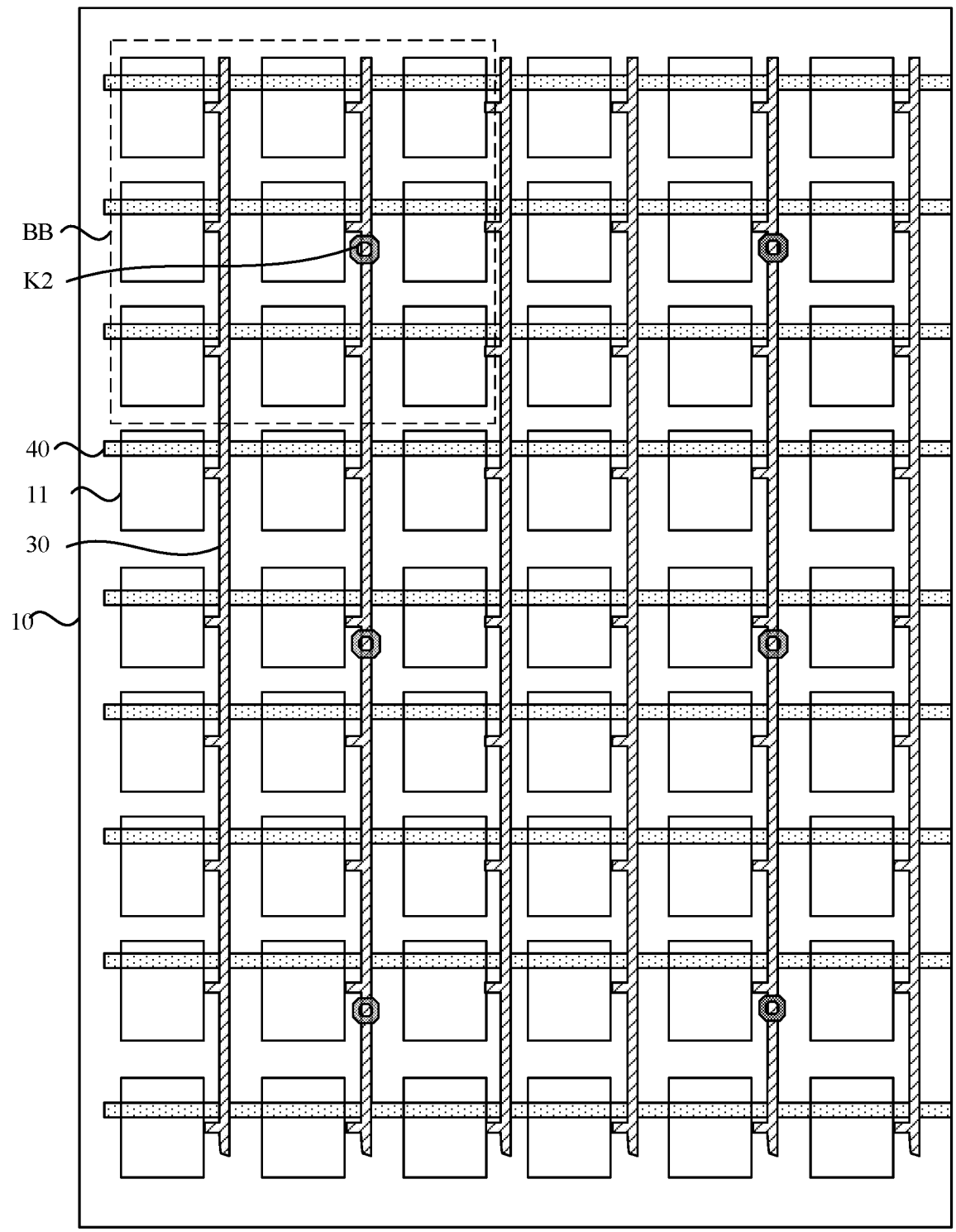
FIG. 15 is a structural diagram of another display panel according to an embodiment of the present disclosure.

Optionally, FIG. 15 is a structural diagram of another display panel according to an embodiment of the present disclosure. As shown in FIG. 15, the display panel 100 includes a plurality of first regions BB, the number of sub-pixels in each first region BB is the same, and each of the plurality of first region BB corresponds to a respective one of the second vias K2. In each first region BB, the second via K2 is electrically connected to a first power line 30 or a second power line 40 closest to a center of the each second region BB.

It is to be noted that in order to clearly show a location of a second via K2 in each first region BB, FIG. 15 only shows the sub-pixels 11, the first power lines 30, the second power lines 40 and the second vias K2, but does not show the connection units and the power bus.

In the embodiment, in each first region BB, the second via K2 is electrically connected to one first power line 30 or one second power line 40 closest to the center of the each first region BB, so that in a case of unchanging the setting of the first power lines 30 and the second power lines 40, the power voltages acquired by the sub-pixels 11 in the each first region BB within the display panel 100 are relative uniform, thereby further improving the display uniformity of the display panel.

Figure 16:
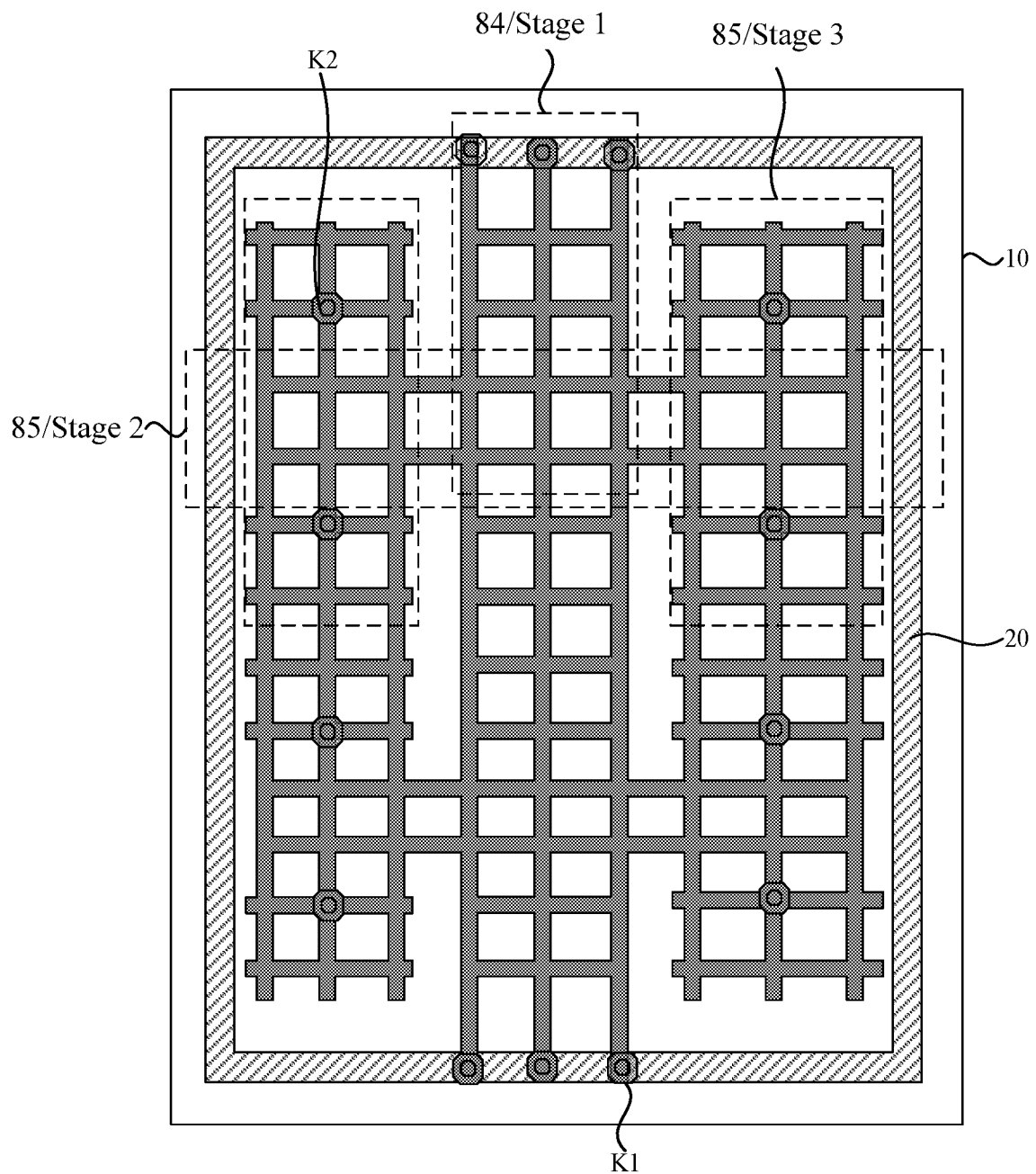
FIG. 16 is a structural diagram of another display panel according to an embodiment of the present disclosure.

Optionally, referring to FIGS. 5 and 11, the first branch 80 includes the connection lines. Alternatively, FIG. 16 is a structural diagram of another display panel according to an embodiment of the present disclosure. As shown in FIG. 16, the first branch 80 includes a connection grid. In a case where the first branch 80 includes the connection grid, each connection sub-unit is a grid, so that the resistance of the formed connection unit 50 is small, and the voltage drop of the power voltage transmitted on the connection unit 50 is small.

The above examples are only given in a case where the display panel is not a specially-shaped display panel. Of course, in a case where the display panel is a specially-shaped display panel, the same is applied to the above-described embodiments. In addition, in a case where the display panel is the specially-shaped display panel, it can be separately set according to characteristics of the specially-shaped display panel itself.

Figure 17:
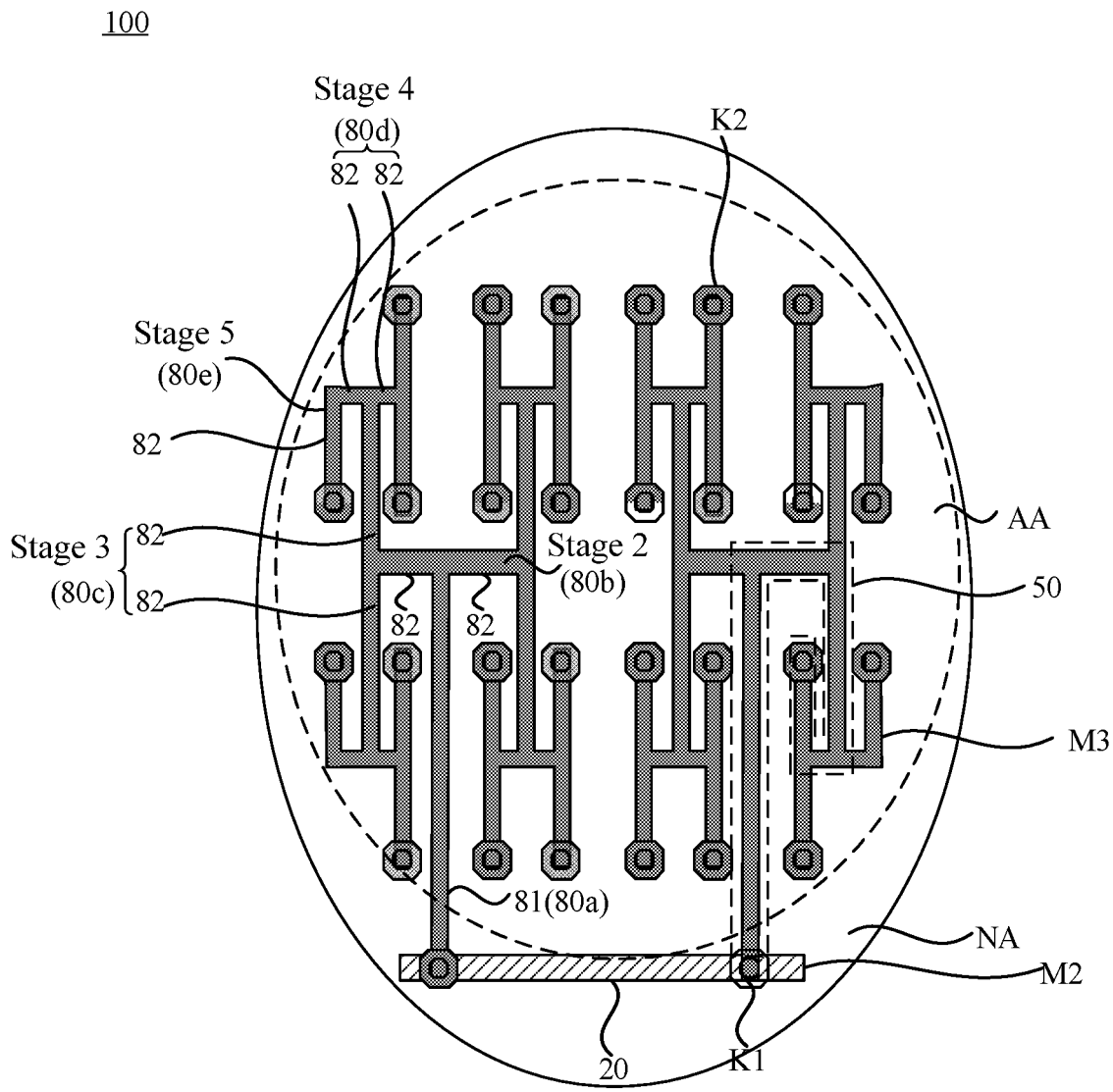
FIG. 17 is a structural diagram of another display panel according to an embodiment of the present disclosure.

Optionally, FIG. 17 is a structural diagram of another display panel according to an embodiment of the present disclosure. As shown in FIG. 17, in a case where the display panel 100 is the specially-shaped display panel, a first branch 80 of stage N, close to a side of the non-display region NA, in the first branch 80 of stages 1 to N may be provided with only one branch, that is, including only one connection sub-unit.

Exemplarily, referring to FIG. 17, the power bus 20 partially surrounds the display panel AA. N is equal to 5, and the number of the first branches 80 is 2, that is, the patterned structure includes two first branches 80 and each first branch 80 includes stages 1 to 5. Specifically, in each first branch 80, a first branch 80a of stage 1 includes one first connection sub-unit 81, each first branch 80b of stage 2 includes two second connection sub-units 82 with opposite extension directions and having the same length, each first branch 80c of stage 3 includes two second connection sub-units 82 with opposite extension directions and having the same length, and each first branch 80d of stage 4 includes two second connection sub-units 82 with opposite extension directions and having the same length. A first branch 80e of stage 5 close to a side of the non-display region NA includes one second connection sub-unit 82. A first end of the first connection sub-unit 81 is electrically connected to the power bus 20 through a first via K1, and a second end of the first connection sub-unit 81 is electrically connected to first ends of two second connection sub-unit 82 of a first branch 80b of stage 2 separately. A second end of each second connection sub-unit 82 of the first branch 80b of stage 2 is electrically connected to first ends of two second connection sub-units 82 of a respective first branch 80c of stage 3 separately, a second end of each second connection sub-unit 82 of the respective first branch 80c of stage 3 is electrically connected to a first end of each second connection sub-unit 82 of the respective first branch 80d of stage 4, a second end of each second connection sub-unit 82 of the respective first branch 80d of stage 4 is electrically connected to first ends of two second connection sub-units 82 of the respective first branch 80e of stage 5 separately, and a second end of each second connection sub-unit 82 of the respective first branch 80e of stage 5 is electrically connected to one first power line or one second power line through a second via K2. Each connection unit 50 includes the first connection sub-unit 81, one second connection sub-unit 82 of stage 2, one second connection sub-unit 82 of stage 3, one second connection sub-unit 82 of stage 4 and one second connection sub-unit 82 of stage 5, so that one first branch 80 includes 14 connection units 50. In a case where the patterned structure includes two first branches and each first branch 80 includes stages 1 to 5, the two first branches include 28 connection units 50. The power voltages acquired by the connection units 50 are transmitted to the first power lines or the second power lines through the second vias K2, that is, each second via K2 is a point contact source. Each point contact source supplies a power voltage to sub-pixels around the point contact source, which is equivalent to the specially-shaped display panel being divided into 14 small regions, and each point contact source is responsible for providing the power voltage to the sub-pixels in one small region, thus reducing the drop amplitude of the power voltage in the small regions and improving the uniformity of the specially-shaped display panel as a whole. In addition, the connection units 50 are formed by providing branches, thus reducing wiring of the connection units 50 and simplifying process steps.

Figure 18:
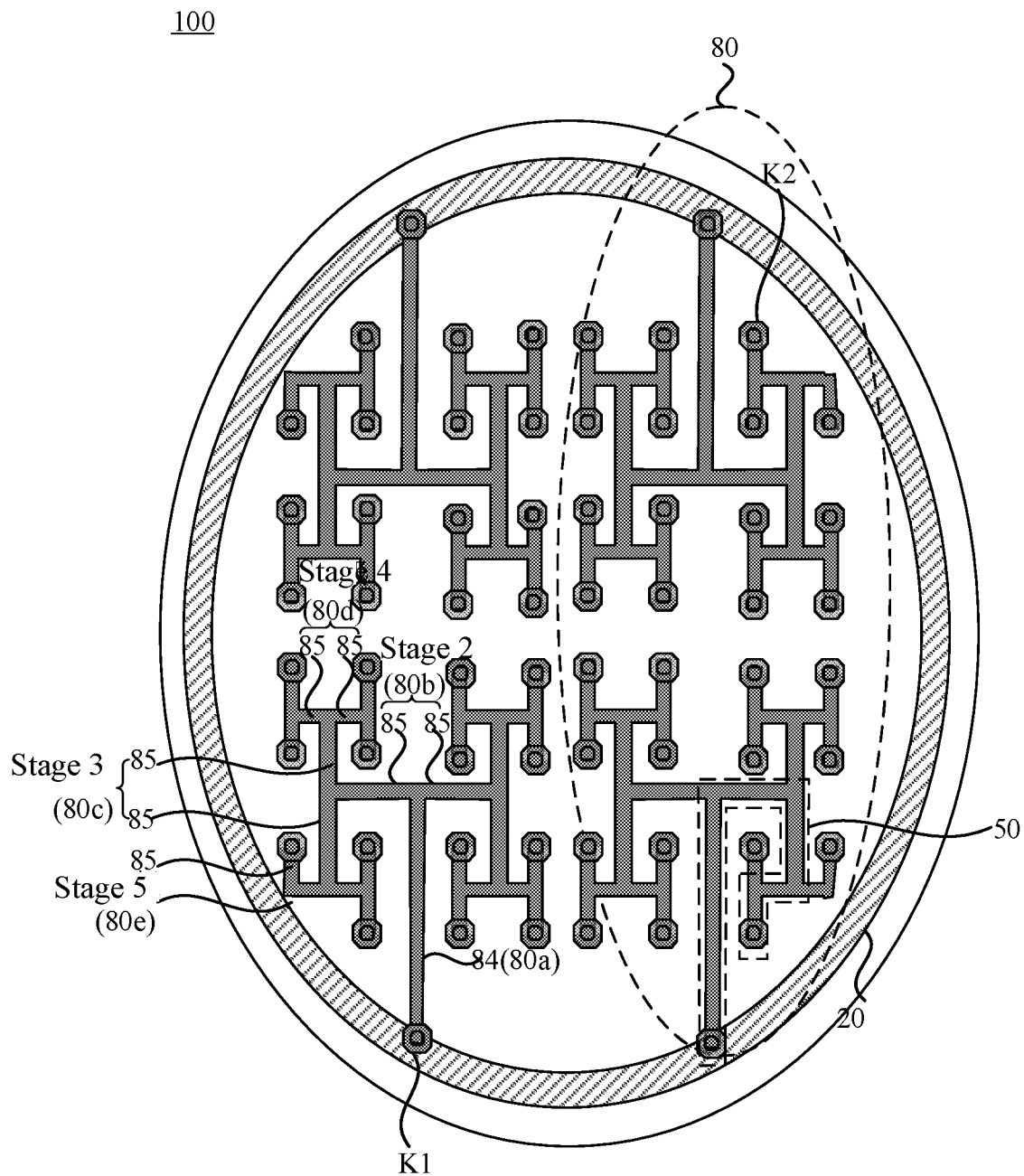
FIG. 18 is a structural diagram of another display panel according to an embodiment of the present disclosure.

It is to be understood that, FIG. 17 is only described with the example that the power bus 20 partially surrounds the display panel AA, N is equal to 5, and the number of first branches 80 is 2. In a case where the power bus 20 surrounds the display panel AA and the Value of N and the number of first branches are changed, the above rule is also followed, referring, for example, FIG. 18.

It is be noted that the specially-shaped display panel includes a variety of types, the above example only takes the specially-shaped display panel being an elliptical specially-shaped display panel as an example, which does not constitute a limitation to the present disclosure, and those skilled in the art may set the location of each connection unit (a location where the second via K2 is connected to the first power line or the second power line) according to the actual type of the specially-shaped display panel, as long as the power voltage drop can be reduced by the connection unit 50.

Figure 19:
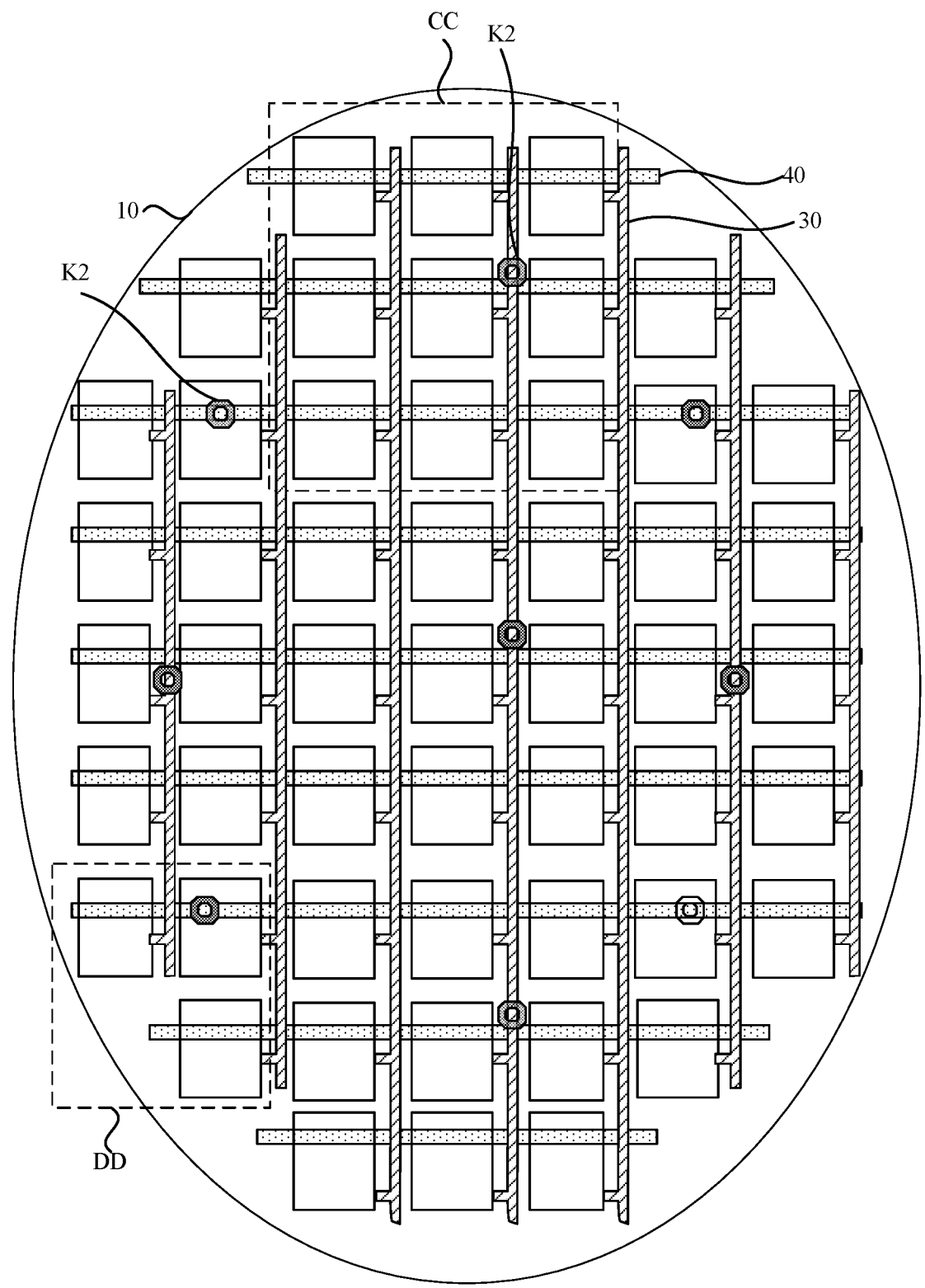
FIG. 19 is a structural diagram of another display panel according to an embodiment of the present disclosure.

Optionally, FIG. 19 is a structural diagram of another display panel according to an embodiment of the present disclosure. As shown in FIG. 19, the display panel 100 is a specially-shaped display panel and includes a plurality of second regions CC and a plurality of third regions DD, where the plurality of third regions DD encircles the one second region CC. The number of sub-pixels in each second region CC is the same, and the number of sub-pixels 11 in each third region DD is less than the number of sub-pixels 11 in the each second region CC. In each second region CC, the second via K2 is electrically connected to one first power line 30 or one second power line 40 closest to a center of the each second region CC, and in each third region DD, the second via K2 is electrically connected to one first power line 30 or one second power line 40 closest to a barycenter of the each third region DD.

It is to be noted that in order to clearly show a location of a second via K2 in each second region CC and a location of a second via K2 in each third region DD, FIG. 19 only shows the sub-pixels 11, the first power lines 30, the second power lines 40 and the second vias K2, but does not show the connection units and the power bus.

Considering that in a case where the display panel 100 is the specially-shaped display panel, the number of sub-pixels 11 in the third region DD is different from the number of sub-pixels 11 in the second region CC and the number of sub-pixels 11 in a part of rows or columns in the third region DD is different from the number of sub-pixels 11 in the other rows or columns due to an irregular shape of the third region DD, in the embodiment, in each third region DD, the second via K2 is electrically connected to one first power line 30 or one second power line 40 closest to the barycenter of the each third region DD, so that the power voltages acquired by the respective sub-pixel 11 in the each third region DD are relative uniform. That is, in each second region CC, the second via K2 is electrically connected to the one first power line 30 or the one second power line 40 closest to the center of the each second region CC, and in each third region DD, the second via K2 is electrically connected to the one first power line 30 or the one second power line 40 closest to the barycenter of the each third region DD, so that in a case of unchanging the setting of the first power lines 30 and the second power lines 40, the power voltages acquired by the sub-pixels 11 in each second region CC and each third region DD within the display panel 100 are relative uniform, thereby further improving the uniformity of display on the display panel.

It is to be noted that when an area of each third region DD is small, that is, the number of sub-pixels in each third region DD is small, the second via K2 may not be provided in the each third region DD. Of course, the above examples do not limit the present disclosure, and the location of the second via K2 can be set by those skilled in the art according to practical situations.

It is to be noted that FIG. 19 is exemplarily illustrated by taking a case where the second end of the connection unit 50 is electrically connected to the first power line 30 or the second power line 40 through the second via K2.

Based on the same concept, a display device is further provided according to an embodiment of the present disclosure. The display device includes the display panel described in any embodiment of the present disclosure. Therefore, the display device provided by the embodiment of the present disclosure has the corresponding beneficial effects of the display panel provided by the embodiments of the present disclosure, which is not repeated here. Exemplarily, the display device may be a mobile phone, a computer, a smart wearable device (for example, a smart watch), an onboard display device, and other electronic devices, which is not limited in the embodiment of the present disclosure.

Figure 20:
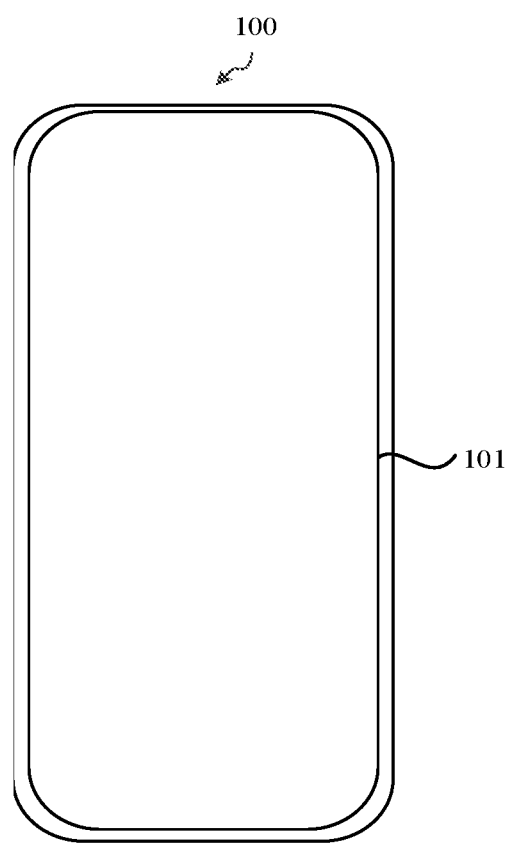
FIG. 20 is a structural diagram of a display device according to an embodiment of the present disclosure.

Exemplarily, FIG. 20 is a structural diagram of a display device according to an embodiment of the present disclosure. As shown in FIG. 20, the display device 101 includes the display panel 100 in the embodiments described above.

It is to be noted that the above are merely preferred embodiments of the present disclosure and the technical principles used therein. It is to be understood by those skilled in the art that the present disclosure is not limited to the particular embodiments described herein. Those skilled in the art can make various apparent modifications, adaptations and substitutions without departing from the scope of the present disclosure. Therefore, while the present disclosure has been described in detail via the above embodiments, the present disclosure is not limited to the above embodiments and may include other equivalent embodiments without departing from the concept of the present disclosure. The scope of the present disclosure is determined by the scope of the appended claims.

What is claimed is:

1. A display panel, comprising:
a base substrate;
a plurality of sub-pixels arranged in an array, a power bus, a plurality of first power lines and a plurality of second power lines which are located at a side of the base substrate, wherein the plurality of first power lines extend along a column direction and the plurality of second power lines extend along a row direction, wherein each of the plurality of first power lines is electrically connected to the plurality of sub-pixels arranged along the column direction, wherein the plurality of first power lines and the plurality of second power lines have perpendicular projections respectively on a top surface of the base substrate, and wherein the plurality of first power lines are electrically connected to the plurality of second power lines in overlapping regions of the perpendicular projections; and
a plurality of connection units, wherein a first end of each of the plurality of connection units is electrically connected to the power bus, wherein a second end of each of the plurality of connection units is electrically connected to either one of the plurality of first power lines or one of the plurality of second power lines, wherein vertical projections of the second ends of the plurality of connection units on the top surface of the base substrate do not overlap one another,
wherein electrical resistances of the plurality of connection units are substantially the same;
wherein the display panel further comprises: a first metal layer, a first insulating layer, a second metal layer, a second insulating layer and a third metal layer which are disposed in sequence on the top surface of base substrate;
wherein the plurality of second power lines is disposed in the first metal layer;
wherein the power bus and the plurality of first power lines are disposed in the second metal layer;
wherein the plurality of connection units is disposed in the third metal layer;
wherein the first end of each of the plurality of connection units is electrically connected to the power bus through a first via, and the second end of each of the plurality of connection units is electrically connected to the one of the plurality of first power lines or the one of the plurality of second power lines through one of second vias;
wherein the display panel further comprises: a display region and a non-display region, wherein the power bus is located in the non-display region, and the power bus partially surrounds the display region;
wherein the third metal layer comprises a patterned structure, wherein the patterned structure comprises at least one first branch of stages 1 to N, a first branch of stage 1 comprises one first connection sub-unit, and each first branch of each of stages 2 to N comprises two second connection sub-units with opposite extension directions and having a same length;
wherein a first end of the one first connection sub-unit is electrically connected to the power bus through the first via, and a second end of the one first connection sub-unit is electrically connected to first ends of two second connection sub-units of the first branch of stage 2 separately;
wherein a second end of each of two second connection sub-units of each first branch of stage i is electrically connected to first ends of two second connection sub-units of a respective first branch of stage i+1 separately;
wherein a second end of each of two second connection sub-units of the first branch of stage N−1 is electrically connected to first ends of two second connection sub-units of the respective first branch of stage N separately, and a second end of each of the two second connection sub-units of the respective first branch of stage N is electrically connected to one of the plurality of first power lines or one of the plurality of second power lines through one of the second vias;
wherein N and i are both positive integers, and N≥3, 2≤i≤N−1; and
wherein each of the plurality of connection units comprises the one first connection sub-unit and second connection sub-units in stages 2 to N, and a number of second connection sub-units in each stage is 1.

2. The display panel of claim 1, wherein a difference of an electrical resistance between any two of the plurality of connection units is 0.

3. The display panel of claim 1, wherein the plurality of connection units comprises a same material, a same length and a same cross-sectional area.

4. The display panel of claim 1, wherein vertical projections of the plurality of connection units on the top surface of the base substrate are located within vertical projections of at least one of the plurality of first power lines or the plurality of second power lines on the top surface of the base substrate.

5. The display panel of claim 1, wherein the second insulating layer comprises an organic insulating layer.

6. The display panel of claim 1, wherein second ends of second connection sub-units of a part of the first branches of stage N are electrically connected, and wherein the part of the first branches of stage N are adjacent and connected to respective different first branches of stage N−1.

7. The display panel of claim 1, wherein the patterned structure comprises a connection collar, wherein the connection collar is electronically connected to a plurality of first vias, and wherein the second end of the one first connection sub-unit extends to the connection collar.

8. The display panel of claim 1, wherein a first branch of each odd stage is in the column direction, and a first branch of each even stage is in the row direction.

9. The display panel of claim 1, wherein a first branch of stage j is axisymmetric about a first branch of stage j−1, wherein j≥2.

10. The display panel of claim 1, comprising: a plurality of first regions, wherein a number of sub-pixels in each of the plurality of first regions is the same, and each of the plurality of first regions corresponds to a respective one of the second vias; and
wherein in the each of the plurality of first regions, the respective one of the second vias is connected to one of the plurality of first power lines or one of the plurality of second power lines, which is closest to a center of the each of the plurality of first regions.

11. The display panel of claim 1, wherein each of the at least one first branch of stages 1 to N comprises a connection line or a connection grid.

12. The display panel of claim 1, wherein each of the plurality of sub-pixels comprises a light-emitting element and a driving circuit, wherein the driving circuit comprises a storage capacitance and at least one thin film transistor, wherein the storage capacitance comprises a first electrode and a second electrode, and wherein the thin film transistor comprises a gate, a source and a drain; wherein the display panel further comprises a fourth metal layer located between the first metal layer and the base substrate; and
wherein the first electrode and the gate are disposed in the fourth metal layer.

13. The display panel of claim 1, wherein the display panel is a specially-shaped display panel and comprises a plurality of second regions and a plurality of third regions, wherein the plurality of third regions encircle the plurality of second regions;
wherein a number of sub-pixels in each of the plurality of second regions is the same, and a number of sub-pixels in each of the plurality of third regions is less than the number of sub-pixels in each of the plurality of second regions;
wherein in each of the plurality of second regions, a second end of a respective one of the plurality of connection units is electrically connected to one of the plurality of first power lines or one of the plurality of second power lines, which is closest to a center of each of the plurality of second regions; and
wherein in each of the plurality of third regions, a second end of a respective one of the plurality of connection units is electrically connected to one of the plurality of first power lines or one of the plurality of second power lines, which is closest to a barycenter of the each of the plurality of third regions.

14. A display panel, comprising:
a base substrate;
a plurality of sub-pixels arranged in an array, a power bus, a plurality of first power lines and a plurality of second power lines which are located at a side of the base substrate, wherein the plurality of first power lines extend along a column direction and the plurality of second power lines extend along a row direction, wherein each of the plurality of first power lines is electrically connected to the plurality of sub-pixels arranged along the column direction, wherein the plurality of first power lines and the plurality of second power lines have perpendicular projections respectively on a top surface of the base substrate, and wherein the plurality of first power lines are electrically connected to the plurality of second power lines in overlapping regions of the perpendicular projections; and
a plurality of connection units, wherein a first end of each of the plurality of connection units is electrically connected to the power bus, wherein a second end of each of the plurality of connection units is electrically connected to either one of the plurality of first power lines or one of the plurality of second power lines, and wherein vertical projections of the second ends of the plurality of connection units on the top surface of the base substrate do not overlap one another;
wherein electrical resistances of the plurality of connection units are substantially the same;
wherein the display panel further comprises: a first metal layer, a first insulating layer, a second metal layer, a second insulating layer and a third metal layer which are disposed in sequence on the top surface of base substrate;
wherein the plurality of second power lines is disposed in the first metal layer;
wherein the power bus and the plurality of first power lines are disposed in the second metal layer;
wherein the plurality of connection units is disposed in the third metal layer;
wherein the first end of each of the plurality of connection units is electrically connected to the power bus through a first via, and the second end of each of the plurality of connection units is electrically connected to the one of the plurality of first power lines or the one of the plurality of second power lines through one of second vias;
the display panel further comprises: a display region and a non-display region, wherein the power bus is located in the non-display region, and the power bus encircles the display region;
wherein the third metal layer comprises a patterned structure, the patterned structure comprises at least one first branch of stages 1 to N, the first branch of stage 1 comprises two third connection sub-units, and wherein each first branch of each of stages 2 to N comprises two of fourth connection sub-units with opposite extension directions and having a same length;
wherein first ends of the two third connection sub-unit are electrically connected to opposite sides of the power bus through the first vias respectively, and a second end of each of the two third connection sub-units is electrically connected to first ends of two fourth connection sub-units of a respective first branch of stage 2 separately;
wherein a second end of each of two fourth connection sub-units of each first branch of stage i is electrically connected to first ends of two fourth connection sub-units of a respective first branch of stage i+1 separately;

wherein a second end of each of two fourth connection sub-unit of the first branch of stage N−1 is electrically connected to the first ends of two fourth connection sub-units of a respective first branch of stage N separately, and a second end of each of the two fourth connection sub-units of the respective first branch of stage N is electrically connected to a respective one of the plurality of first power lines or a respective one of the plurality of second power lines through one of the second vias;

wherein N and i are both positive integers, and N≥3 2≤i≤N−1; and wherein each of the plurality of connection units comprises one third connection sub-unit and fourth connection sub-units in stages 2 to N, and wherein a number of fourth connection sub-units in each stage is 1.

15. The display panel of claim 14, wherein second ends of four connection sub-units of a part of the first branches of stage N are electrically connected, and wherein the part of the first branches of stage N are adjacent and connected to respective different first branches of stage N−1.

16. The display panel of claim 14, wherein the patterned structure comprises a connection collar, wherein the connection collar is electronically connected to a plurality of first vias, and second ends of two third connection sub-units in the same first branch are electrically connected.

17. The display panel of claim 14, wherein the first branch of stage j is axisymmetric about the first branch of stage j−1, wherein j≥2.

18. A display device, comprising a display panel, wherein the display panel comprises:
a base substrate;
a plurality of sub-pixels arranged in an array, a power bus, a plurality of first power lines and a plurality of second power lines which are located at a side of the base substrate, wherein the plurality of first power lines extend along a column direction and the plurality of second power lines extend along a row direction, wherein each of the plurality of first power lines is electrically connected to a plurality of sub-pixels arranged along the column direction, wherein the plurality of first power lines and the plurality of second power lines have perpendicular projections respectively on a top surface of the base substrate, and wherein the plurality of first power lines are electrically connected to the plurality of second power lines in overlapping regions of the perpendicular projections; and
a plurality of connection units, wherein a first end of each of the plurality of connection units is electrically connected to the power bus, wherein a second end of each of the plurality of connection units is electrically connected to either one of the plurality of first power lines or one of the plurality of second power lines, wherein vertical projections of the second ends of the plurality of connection units on the top surface of the base substrate do not overlap one another, wherein electrical resistances of the plurality of connection units are substantially the same;

wherein the display panel further comprises: a first metal layer, a first insulating layer, a second metal layer, a second insulating layer and a third metal layer which are disposed in sequence on the top surface of base substrate;

wherein the plurality of second power lines is disposed in the first metal layer;

wherein the power bus and the plurality of first power lines are disposed in the second metal layer;

wherein the plurality of connection units is disposed in the third metal layer;

wherein the first end of each of the plurality of connection units is electrically connected to the power bus through a first via, and the second end of each of the plurality of connection units is electrically connected to the one of the plurality of first power lines or the one of the plurality of second power lines through one of second vias;

wherein the display panel further comprises: a display region and a non-display region, wherein the power bus is located in the non-display region, and the power bus partially surrounds the display region;

wherein the third metal layer comprises a patterned structure, wherein the patterned structure comprises at least one first branch of stages 1 to N, a first branch of stage 1 comprises one first connection sub-unit, and each first branch of each of stages 2 to N comprises two second connection sub-units with opposite extension directions and having a same length;

wherein a first end of the one first connection sub-unit is electrically connected to the power bus through the first via, and a second end of the one first connection sub-unit is electrically connected to first ends of two second connection sub-units of the first branch of stage 2 separately;

wherein a second end of each of two second connection sub-units of each first branch of stage i is electrically connected to first ends of two second connection sub-units of a respective first branch of stage i+1 separately;

wherein a second end of each of two second connection sub-units of the first branch of stage N−1 is electrically connected to first ends of two second connection sub-units of the respective first branch of stage N separately, and a second end of each of the two second connection sub-units of the respective first branch of stage N is electrically connected to one of the plurality of first power lines or one of the plurality of second power lines through one of the second vias;

wherein N and i are both positive integers, and N≥3, 2≤i≤N−1; and wherein each of the plurality of connection units comprises the one first connection sub-unit and second connection sub-units in stages 2 to N, and a number of second connection sub-units in each stage is 1.

* * * * *